(12) United States Patent
Popplewell et al.

(10) Patent No.: US 10,541,682 B2
(45) Date of Patent: Jan. 21, 2020

(54) MANIFOLDED GATE RESISTANCE NETWORK

(71) Applicant: SKYWORKS SOLUTIONS, INC., Woburn, MA (US)

(72) Inventors: Peter Harris Robert Popplewell, Ottawa (CA); Ambarish Roy, Waltham, MA (US); Guillaume Alexandre Blin, Carlisle, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 141 days.

(21) Appl. No.: 15/806,513

(22) Filed: Nov. 8, 2017

(65) Prior Publication Data

US 2018/0131369 A1 May 10, 2018

Related U.S. Application Data

(60) Provisional application No. 62/420,398, filed on Nov. 10, 2016.

(51) Int. Cl.
*H03K 17/687* (2006.01)
*H01L 27/12* (2006.01)
*H01L 27/02* (2006.01)
*H01L 23/66* (2006.01)

(52) U.S. Cl.
CPC ....... *H03K 17/687* (2013.01); *H01L 27/0274* (2013.01); *H01L 27/1203* (2013.01); *H01L 23/66* (2013.01)

(58) Field of Classification Search
CPC .. H03K 17/687; H03K 17/102; H03K 17/693; H03K 2217/0018; H01L 27/0274; H01L 27/1203; H01L 23/66; H01L 2224/48091; H01L 2224/48227; H01L 2924/15192; H01L 2924/15313; H01L 2924/19105; H01L 27/12; H01L 27/02
See application file for complete search history.

(56) References Cited

U.S. PATENT DOCUMENTS

2016/0373106 A1* 12/2016 Shah ................... H01L 27/0207

* cited by examiner

*Primary Examiner* — Robert L Deberadinis
(74) *Attorney, Agent, or Firm* — Chang & Hale LLP

(57) ABSTRACT

A radio-frequency switch includes a pole node, a throw node connected to the pole node via a radio-frequency signal path, the radio-frequency signal path including first, second, third and fourth field-effect transistors connected in series, each of the first, second, third and fourth field-effect transistors having a gate, a first coupling path coupling the gate of the first field-effect transistor to the gate of the second field-effect transistor, a second coupling path coupling the gate of the third field-effect transistor to the gate of the fourth field-effect transistor, and a third coupling path coupling the first coupling path to the second coupling path.

20 Claims, 18 Drawing Sheets

MANIFOLDED GATE RESISTANCE NETWORK

CROSS-REFERENCE TO RELATED APPLICATION(S)

This application claims priority to U.S. Provisional Application No. 62/420,398 filed Nov. 10, 2016, entitled MANIFOLDED GATE RESISTANCE NETWORK, the disclosure of which is hereby expressly incorporated by reference herein in its respective entirety.

BACKGROUND

Field

The present disclosure generally relates to the field of electronics, and more particularly, to radio-frequency switches.

Description of the Related Art

Radio-frequency (RF) switches, such as transistor switches, can be used to switch signals between one or more poles and one or more throws. Gate resistance in connection with branches or components of RF switches can affect switching performance.

SUMMARY

In accordance with some implementations, the present disclosure relates to a radio-frequency switch comprising a pole node, a throw node connected to the pole node via a radio-frequency signal path, the radio-frequency signal path including first, second, third and fourth field-effect transistors connected in series, each of the first, second, third and fourth field-effect transistors having a gate, a first coupling path coupling the gate of the first field-effect transistor to the gate of the second field-effect transistor, a second coupling path coupling the gate of the third field-effect transistor to the gate of the fourth field-effect transistor, and a third coupling path coupling the first coupling path to the second coupling path.

In some embodiments, the radio-frequency switch further first, second, third and fourth resistors coupled to the gates of the first, second, third and fourth field-effect transistors, respectively. The third coupling path may be coupled to the first coupling path between the first and second resistors and the coupled to the second coupling path between the third and fourth resistors.

The radio-frequency switch may further comprise a gate control input node coupled to the third coupling path. For example, the third coupling path may include fifth and sixth resistors, the gate control input node being coupled to the third coupling path between the fifth and sixth resistors. In some embodiments, the radio-frequency signal path further includes fifth, sixth, seventh and eighth field-effect transistors connected in series with the first, second, third and fourth field-effect transistors, each of the fifth, sixth, seventh and eighth field-effect transistors having a gate. Furthermore, the radio-frequency switch may further comprise a fourth coupling path coupling the gate of the fifth field-effect transistor to the gate of the sixth field-effect transistor, a fifth coupling path coupling the gate of the seventh field-effect transistor to the gate of the eighth field-effect transistor, and a sixth coupling path coupling the fourth coupling path to the fifth coupling path. A seventh coupling path may couple the third coupling path to the sixth coupling path.

In some implementations, the present disclosure relates to a radio-frequency switch comprising a pole node, a throw node connected to the pole node via a radio-frequency signal path, a shunt arm connected between the radio-frequency signal path and a ground reference, the shunt arm including first, second, third and fourth field-effect transistors connected in series, each of the first, second, third and fourth field-effect transistors having a gate node, a first coupling path coupling the gate of the first field-effect transistor to the gate of the second field-effect transistor, a second coupling path coupling the gate of the third field-effect transistor to the gate of the fourth field-effect transistor, and a third coupling path coupling the first coupling path to the second coupling path.

In some embodiments, the radio-frequency switch further comprises first, second, third and fourth resistors coupled to the gates of the first, second, third and fourth field-effect transistors, respectively. The third coupling path may be coupled to the first coupling path between the first and second resistors and the coupled to the second coupling path between the third and fourth resistors. In certain embodiments, the radio-frequency switch further comprises a gate control input node coupled to the third coupling path. The third coupling path may include fifth and sixth resistors, the gate control input node being coupled to the third coupling path between the fifth and sixth resistors.

The radio-frequency signal path may further include fifth, sixth, seventh and eighth field-effect transistors connected in series with the first, second, third and fourth field-effect transistors, each of the fifth, sixth, seventh and eighth field-effect transistors having a gate. In certain embodiments, the radio-frequency switch further comprises a fourth coupling path coupling the gate of the fifth field-effect transistor to the gate of the sixth field-effect transistor, a fifth coupling path coupling the gate of the seventh field-effect transistor to the gate of the eighth field-effect transistor, and a sixth coupling path coupling the fourth coupling path to the fifth coupling path. The radio-frequency switch may further comprise a seventh coupling path coupling the third coupling path to the sixth coupling path.

In some implementations, the present disclosure relates to a radio-frequency switch comprising a pole node connected to a first throw node via a first radio-frequency signal path, the first radio-frequency signal path including a first plurality of field-effect transistors connected in series, a second throw node connected to the pole node via a second radio-frequency signal path, the second radio-frequency signal path including a second plurality of field-effect transistors connected in series, a first shunt arm connected to the first radio-frequency signal path at a first shunt node, the first shunt arm including a third plurality of field-effect transistors connected in series, a second shunt arm connected to the second radio-frequency signal path including a fourth plurality of field-effect transistors connected in series, and a first manifolded gate resistance network connected to either the first plurality of field-effect transistors or the second plurality of field-effect transistors.

The first manifolded gate resistance network may have at least three levels of gate resistances. In certain embodiments, the first manifolded gate resistance network has at least four levels of gate resistances. The radio-frequency switch may further comprise a second manifolded gate resistance network connected to either the third plurality of field-effect transistors of the fourth plurality of field-effect transistors.

DETAILED DESCRIPTION OF SOME EMBODIMENTS

The headings provided herein, if any, are for convenience only and do not necessarily affect the scope or meaning of the claimed invention.

Introduction

Disclosed herein are various examples of a field-effect transistor (FET) device having one or more regions relative to an active FET portion configured to provide a desired operating condition for the active FET. In such various examples, terms such as FET device, active FET portion, and FET are sometimes used interchangeably, with each other, or some combination thereof. Accordingly, such interchangeable usage of terms should be understood in appropriate contexts.

In electronic devices, such as radio-frequency switch devices or the like, the effect of electrostatic discharge (ESD) can involve reduced performance and/or physical damage with respect to certain components of the device. ESD events may involve relatively sudden flow of electrical power between a component of an electronic device, such as a switch device, and a charged object that comes in context or within physical proximity of the electronic device, or may result from an electrical short or dielectric breakdown of some kind. Certain electronic devices, such as certain integrated switch modules or devices, may be subject to an ESD strike limit, wherein an ESD event presenting a voltage between two terminals of the device beyond a tolerable threshold may result in fatal or serious damage to the device. Certain embodiments disclosed herein provide for reduced ESD effects on radio-frequency switch devices through the use of manifolded gate resistance networks on series and/or shunt arm transistor stacks.

Figure 1:
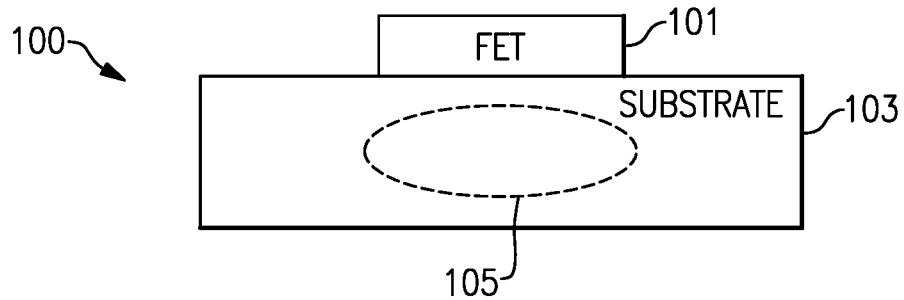
FIG. 1 shows an example of a field-effect transistor (FET) device having an active FET implemented on a substrate, and a region below the active FET configured to include one or more features to provide one or more desirable operating functionalities for the active FET.

FIG. 1 shows an example of a FET device 100 having an active FET 101 implemented on a substrate 103. As described herein, such a substrate can include one or more layers configured to facilitate, for example, operating functionality of the active FET, processing functionality for fabrication and support of the active FET, etc. For example, if the FET device 100 is implemented as a silicon-on-Insulator (SOI) device, the substrate 103 can include an insulator layer such as a buried oxide (BOX) layer, an interface layer, and a handle wafer layer.

FIG. 1 further shows that in some embodiments, a region 105 below the active FET 101 can be configured to include one or more features to provide one or more desirable operating functionalities for the active FET 101. For the purpose of description, it will be understood that relative positions above and below are in the example context of the active FET 101 being oriented above the substrate 103 as shown. Accordingly, some or all of the region 105 can be implemented within the substrate 103. Further, it will be understood that the region 105 may or may not overlap with the active FET 101 when viewed from above (e.g., in a plan view).

Figure 2:
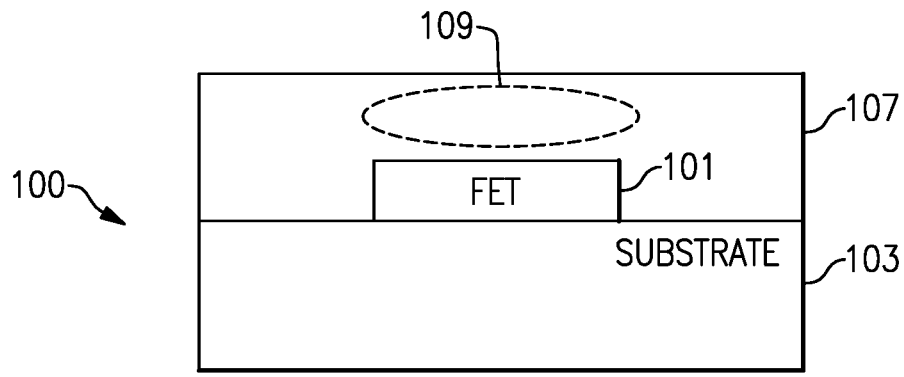
FIG. 2 shows an example of a FET device having an active FET implemented on a substrate, and a region above the active FET configured to include one or more features to provide one or more desirable operating functionalities for the active FET.

FIG. 2 shows an example of a FET device 100 having an active FET 101 implemented on a substrate 103. As described herein, such a substrate can include one or more layers configured to facilitate, for example, operating functionality of the active FET 100, processing functionality for fabrication and support of the active FET 100, etc. For example, if the FET device 100 is implemented as a silicon-on-Insulator (SOI) device, the substrate 103 can include an insulator layer such as a buried oxide (BOX) layer, an interface layer, and a handle wafer layer.

In the example of FIG. 2, the FET device 100 is shown to further include an upper layer 107 implemented over the substrate 103. In some embodiments, such an upper layer can include, for example, a plurality of layers of metal routing features and dielectric layers to facilitate, for example, connectivity functionality for the active FET 100.

FIG. 2 further shows that in some embodiments, a region 109 above the active FET 101 can be configured to include one or more features to provide one or more desirable operating functionalities for the active FET 101. Accordingly, some or all of the region 109 can be implemented within the upper layer 107. Further, it will be understood that the region 109 may or may not overlap with the active FET 101 when viewed from above (e.g., in a plan view).

Figure 3:
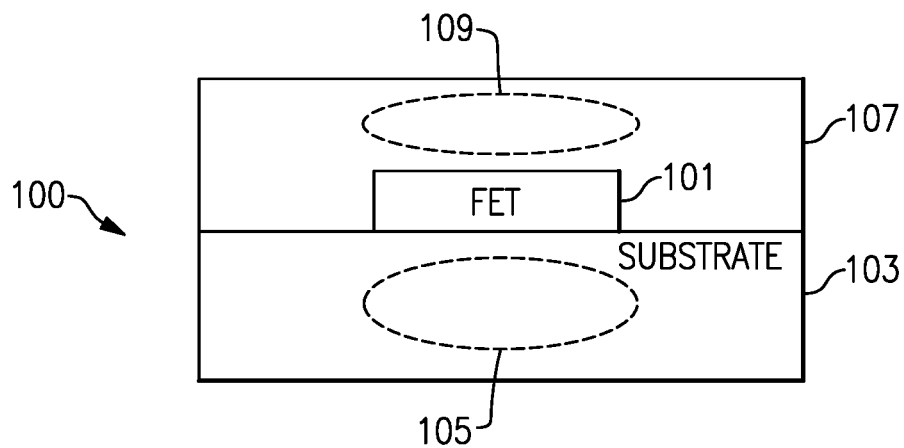
FIG. 3 shows that in some embodiments, a FET device can include both of the regions of FIGS. 1 and 2 relative to an active FET.

FIG. 3 shows an example of a FET device 100 having an active FET 101 implemented on a substrate 103, and also having an upper layer 107. In some embodiments, the substrate 103 can include a region 105 similar to the example of FIG. 1, and the upper layer 107 can include a region 109 similar to the example of FIG. 2.

Examples related to some or all of the configurations of FIGS. 1-3 are described herein in greater detail.

Figure 4:
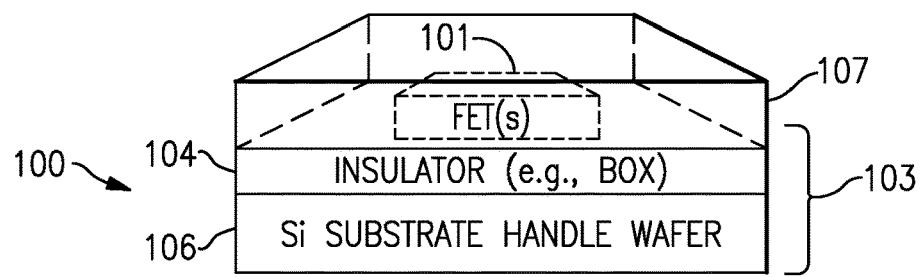
FIG. 4 shows an example FET device implemented as an individual silicon-on-insulator (SOI) unit.
Figure 5:
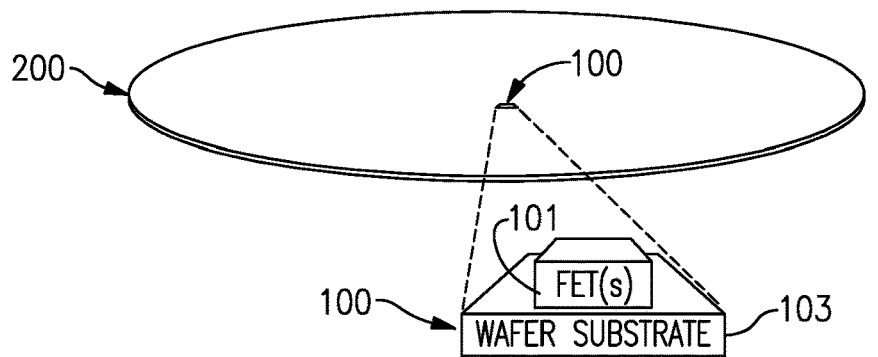
FIG. 5 shows that in some embodiments, a plurality of individual SOI devices similar to the example SOI device of FIG. 4 can be implemented on a wafer.

In the examples of FIGS. 1-3, the FET devices 100 are depicted as being individual units (e.g., as semiconductor die). FIGS. 4-6 show that in some embodiments, a plurality of FET devices having one or more features as described herein can be fabricated partially or fully in a wafer format, and then be singulated to provide such individual units.

For example, FIG. 4 shows an example FET device 100 implemented as an individual SOI unit. Such an individual SOI device can include one or more active FETs 101 implemented over an insulator such as a BOX layer 104 which is itself implemented over a handle layer such as a silicon (Si) substrate handle wafer 106. In the example of FIG. 4, the BOX layer 104 and the Si substrate handle wafer 106 can collectively form the substrate 103 of the examples of FIGS. 1-3, with or without the corresponding region 105.

In the example of FIG. 4, the individual SOI device 100 is shown to further include an upper layer 107. In some embodiments, such an upper layer can be the upper layer 103 of FIGS. 2 and 3, with or without the corresponding region 109.

FIG. 5 shows that in some embodiments, a plurality of individual SOI devices similar to the example SOI device 100 of FIG. 4 can be implemented on a wafer 200. As shown, such a wafer can include a wafer substrate 103 that includes a BOX layer 104 and a Si handle wafer layer 106 as described in reference to FIG. 4. As described herein, one or more active FETs can be implemented over such a wafer substrate.

In the example of FIG. 5, the SOI device 100 is shown without the upper layer (107 in FIG. 4). It will be understood that such a layer can be formed over the wafer substrate 103, be part of a second wafer, or any combination thereof.

Figure 6A:
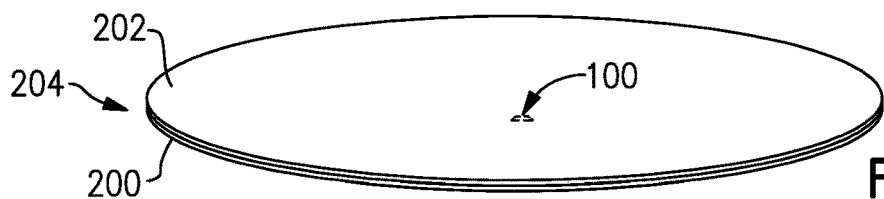
FIG. 6A shows an example wafer assembly having a first wafer and a second wafer positioned over the first wafer.
Figure 6B:
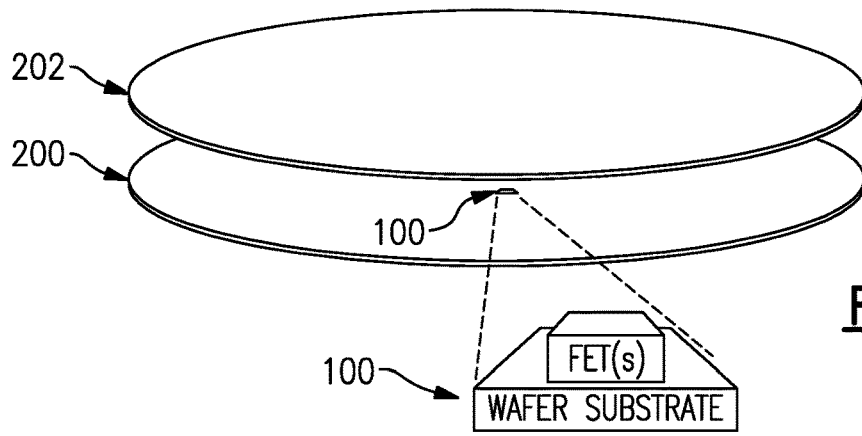
FIG. 6B shows an unassembled view of the first and second wafers of the example of FIG. 6A.

FIG. 6A shows an example wafer assembly 204 having a first wafer 200 and a second wafer 202 positioned over the first wafer 200. FIG. 6B shows an unassembled view of the first and second wafers 200, 202 of the example of FIG. 6A.

In some embodiments, the first wafer 200 can be similar to the wafer 200 of FIG. 5. Accordingly, the first wafer 200 can include a plurality of SOI devices 100 such as the example of FIG. 4. In some embodiments, the second wafer 202 can be configured to provide, for example, a region (e.g., 109 in FIGS. 2 and 3) over a FET of each SOI device 100, and/or to provide temporary or permanent handling wafer functionality for process steps involving the first wafer 200.

Examples of SOI Implementation of FET Devices

Silicon-on-Insulator (SOI) process technology is utilized in many radio-frequency (RF) circuits, including those involving high performance, low loss, high linearity switches. In such RF switching circuits, performance advantage typically results from building a transistor in silicon, which sits on an insulator such as an insulating buried oxide (BOX). The BOX typically sits on a handle wafer, typically silicon, but can be glass, borosilicon glass, fused quartz, sapphire, silicon carbide, or any other electrically-insulating material.

Typically, an SOI transistor is viewed as a 4-terminal field-effect transistor (FET) device with gate, drain, source, and body terminals. However, an SOI FET can be represented as a 5-terminal device, with an addition of a substrate node. Such a substrate node can be biased and/or be coupled one or more other nodes of the transistor to, for example, improve both linearity and loss performance of the transistor. Various examples related to such a substrate node and biasing/coupling of the substrate node are described herein in greater detail.

In some embodiments, such a substrate node can be implemented with a contact layer having one or more features as described herein to allow the contact layer to provide a desirable functionality for the SOI FET. Although various examples are described in the context of RF switches, it will be understood that one or more features of the present disclosure can also be implemented in other applications involving FETs.

Figure 7:
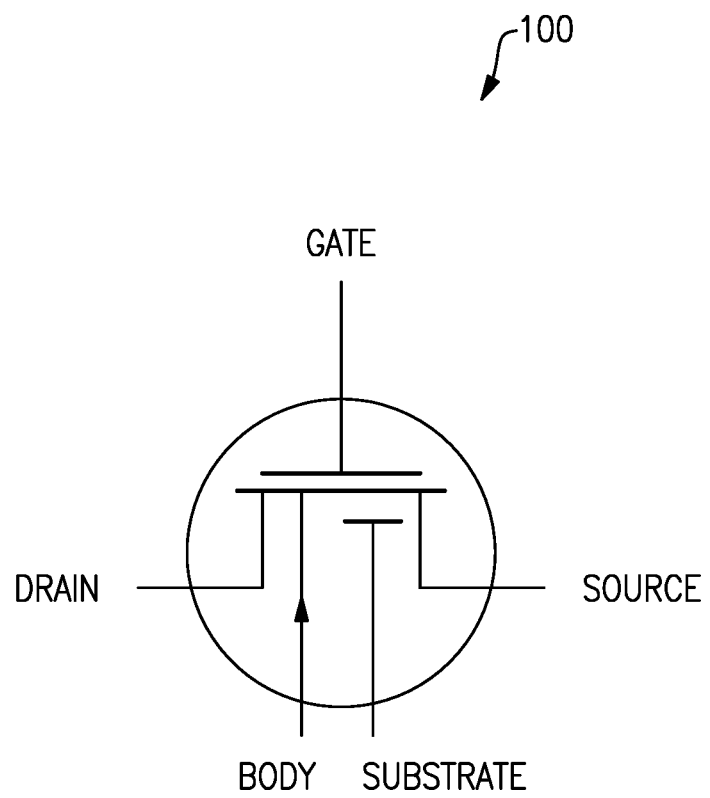
FIG. 7 shows a terminal representation of an SOI FET according to one or more embodiments.

FIG. 7 shows a terminal representation of an SOI FET 100 having nodes associated with a gate, a source, a drain, a body, and a substrate. It will be understood that in some embodiments, the source and the drain can be reversed.

Figure 8A:
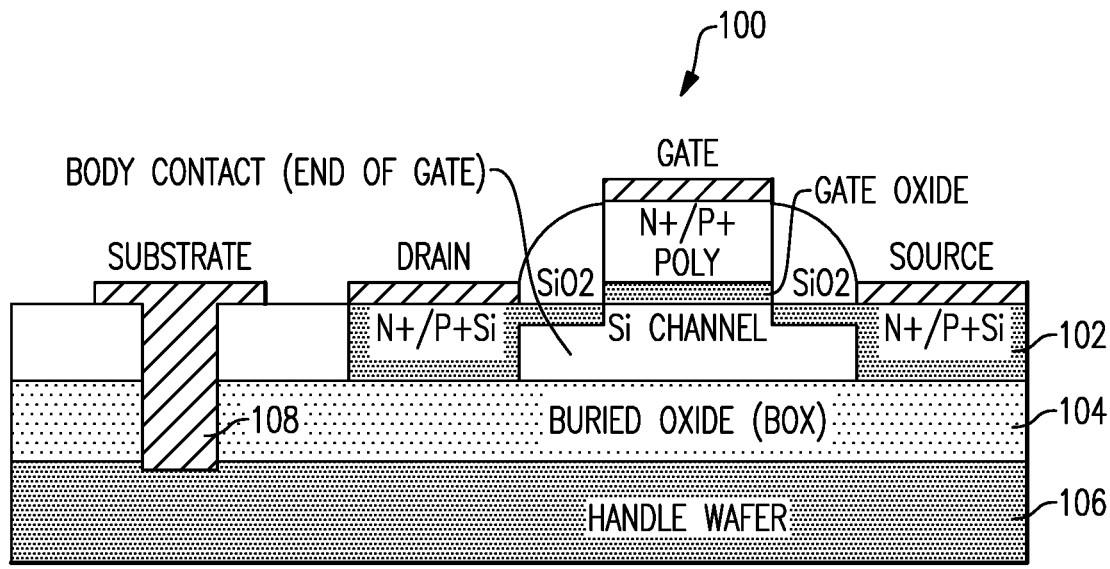
FIGS. 8A and 8B show side sectional and plan views, respectively, of an example SOI FET device according to one or more embodiments.
Figure 8B:
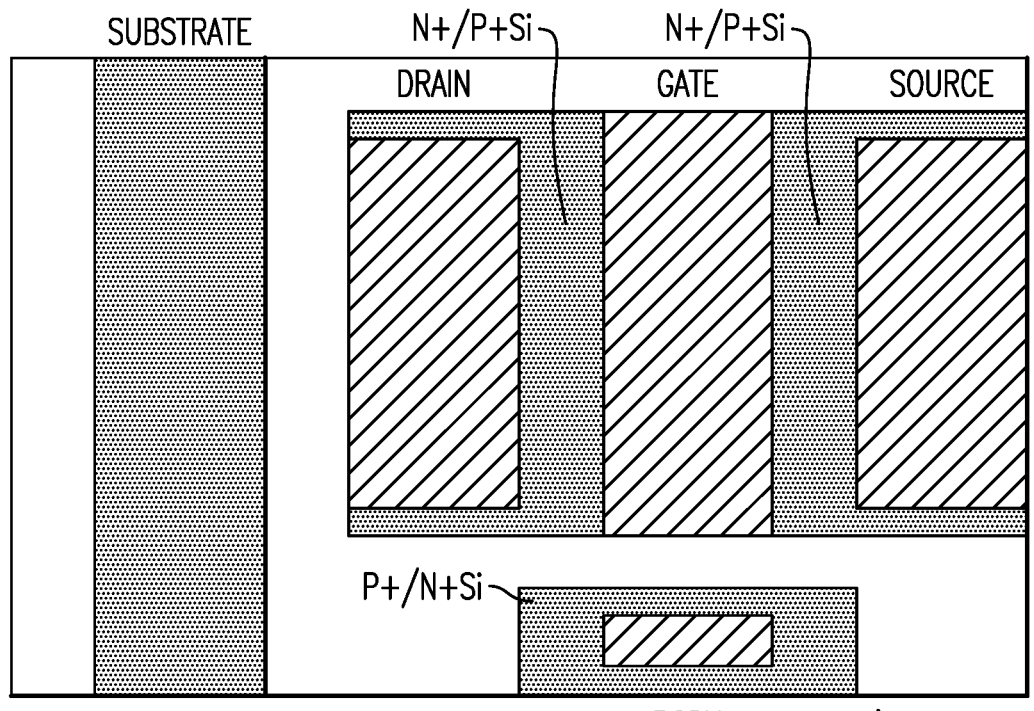

FIGS. 8A and 8B show side sectional and plan views of an example SOI FET device 100 having a node for its substrate. Such a substrate can be, for example, a silicon substrate associated with a handle wafer 106 as described herein. Although described in the context of such a handle wafer, it will be understood that the substrate does not necessarily need to have functionality associated with a handle wafer.

An insulator layer such as a BOX layer 104 is shown to be formed over the handle wafer 106, and a FET structure is shown to be formed based on an active silicon device 102 over the BOX layer 104. In various examples described herein, and as shown in FIGS. 8A and 8B, the FET structure can be configured as an NPN or PNP device.

In the example of FIGS. 8A and 8B, terminals for the gate, source, drain and body are shown to be configured and provided so as to allow operation of the FET. A substrate terminal is shown to be electrically connected to the substrate (e.g., handle wafer) 106 through an electrically conductive feature 108 extending through the BOX layer 104. Such an electrically conductive feature can include, for example, one or more conductive vias, one or more conductive trenches, or any combination thereof. Various examples of how such an electrically conductive feature can be implemented are described herein in greater detail.

In some embodiments, a substrate connection can be connected to ground to, for example, avoid an electrically floating condition associated with the substrate. Such a substrate connection for grounding typically includes a seal-ring implemented at an outermost perimeter of a given die.

In some embodiments, a substrate connection such as the example of FIGS. 8A and 8B can be utilized to bias the substrate 106, to couple the substrate with one or more nodes of the corresponding FET (e.g., to provide RF feedback), or any combination thereof. Such use of the substrate connection can be configured to, for example, improve RF performance and/or reduce cost by eliminating or reducing expensive handle-wafer treatment processes and layers. Such performance improvements can include, for example, improvements in linearity, loss and/or capacitance performance.

In some embodiments, the foregoing biasing of the substrate node can be, for example, selectively applied to achieve desired RF effects only when needed or desired. For example, bias points for the substrate node can be connected to envelope-tracking (ET) bias for power amplifier (PA) to achieve distortion cancelation effects.

In some embodiments, a substrate connection for providing the foregoing example functionalities can be implemented as a seal-ring configuration similar to the grounding configuration, or other connection configurations. Examples of such substrate connections are described herein in greater detail.

Figure 9:
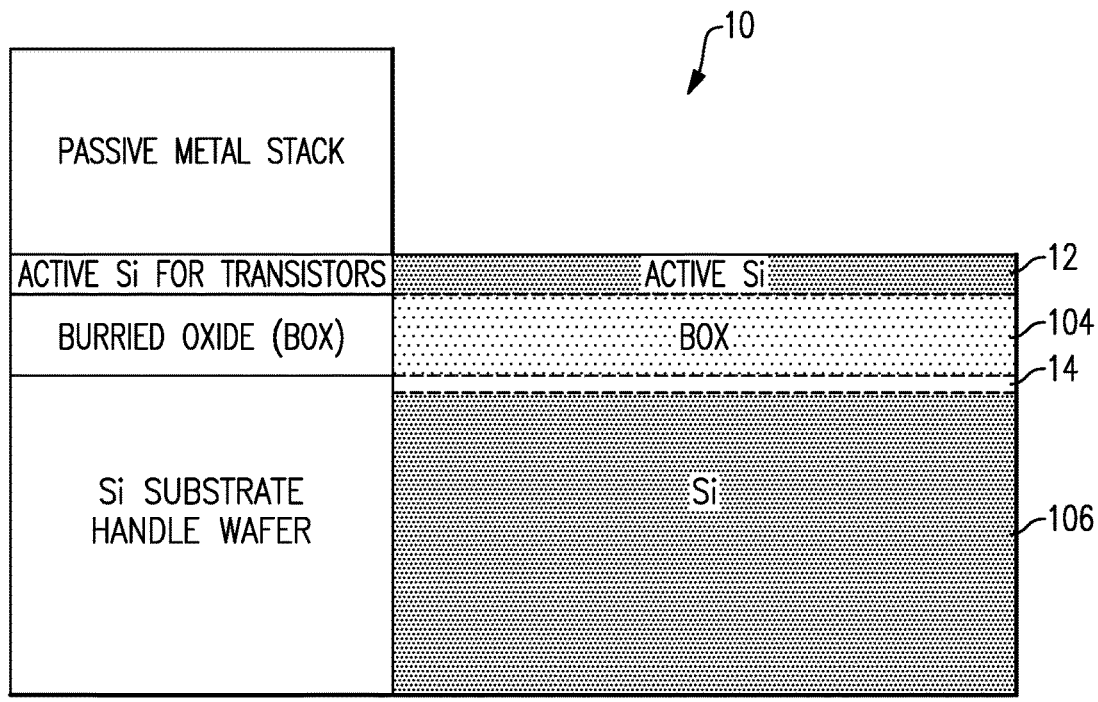
FIG. 9 shows a side sectional view of an SOI substrate that can be utilized to form an SOI FET device according to one or more embodiments.
Figure 10:
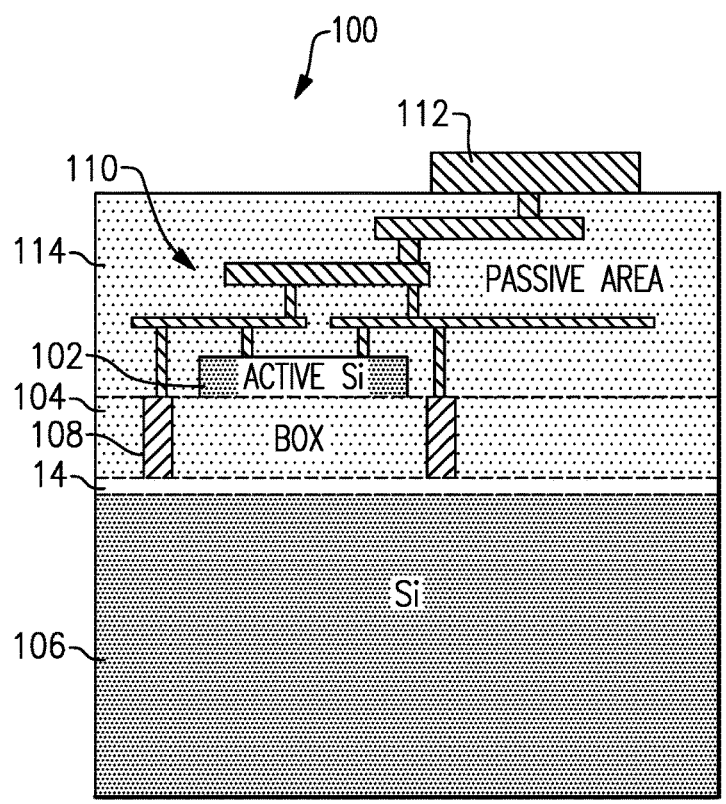
FIG. 10 shows a side sectional view of an SOI FET device according to one or more embodiments.

FIG. 9 shows a side sectional view of an SOI substrate 10 that can be utilized to form an SOI FET device 100 of FIG. 10 having an electrical connection for a substrate layer 106 (e.g., Si handle layer). In FIG. 9, an insulator layer such as a BOX layer 104 is shown to be formed over the Si handle layer 106. An active Si layer 12 is shown to be formed over the BOX layer 104. It will be understood that in some embodiments, the foregoing SOI substrate 10 of FIG. 9 can be implemented in a wafer format, and SOI FET devices having one or more features as described herein can be formed based on such a wafer.

In FIG. 10, an active Si device 102 is shown to be formed from the active Si layer 12 of FIG. 9. One or more electrically conductive features 108 such as vias are shown to be implemented through the BOX layer 104, relative to the active Si device 102. In some embodiments, such conductive features (108) can allow the Si handle layer 106 to be coupled to the active Si device (e.g., a FET), be biased, or any combination thereof. Such coupling and/or biasing can be facilitated by, for example, a metal stack 110. In some embodiments, such a metal stack can allow the conductive features 108 to be electrically connected to a terminal 112. In the example of FIG. 10, one or more passivation layers, one or more dielectric layers, or some combination thereof (collectively indicated as 114) can be formed to cover some or all of such a metal stack.

In some embodiments, a trap-rich layer 14 can be implemented between the BOX layer 104 and the Si handle layer 106. However, and as described herein, the electrical connection to the Si handle layer 106 through the conductive feature(s) 108 can eliminate or reduce the need for such a trap-rich layer which is typically present to control charge at an interface between the BOX layer 104 and the Si handle layer 106, and which can involve costly process steps.

Aside from the foregoing example of eliminating or reducing the need for a trap-rich layer, the electrical connection to the Si handle layer 106 can provide a number of advantageous features. For example, the conductive feature(s) 108 can allow forcing of excess charge at the BOX/Si handle interface to thereby reduce unwanted harmonics. In another example, excess charge can be removed through the conductive feature(s) 108 to thereby reduce the off-capacitance (Coff) of the SOI FET. In yet another example, the presence of the conductive feature(s) 108 can lower the threshold of the SOI FET to thereby reduce the on-resistance (Ron) of the SOI FET.

Examples Related to Fabrication of SOI FET Devices

Figures 11, 12:
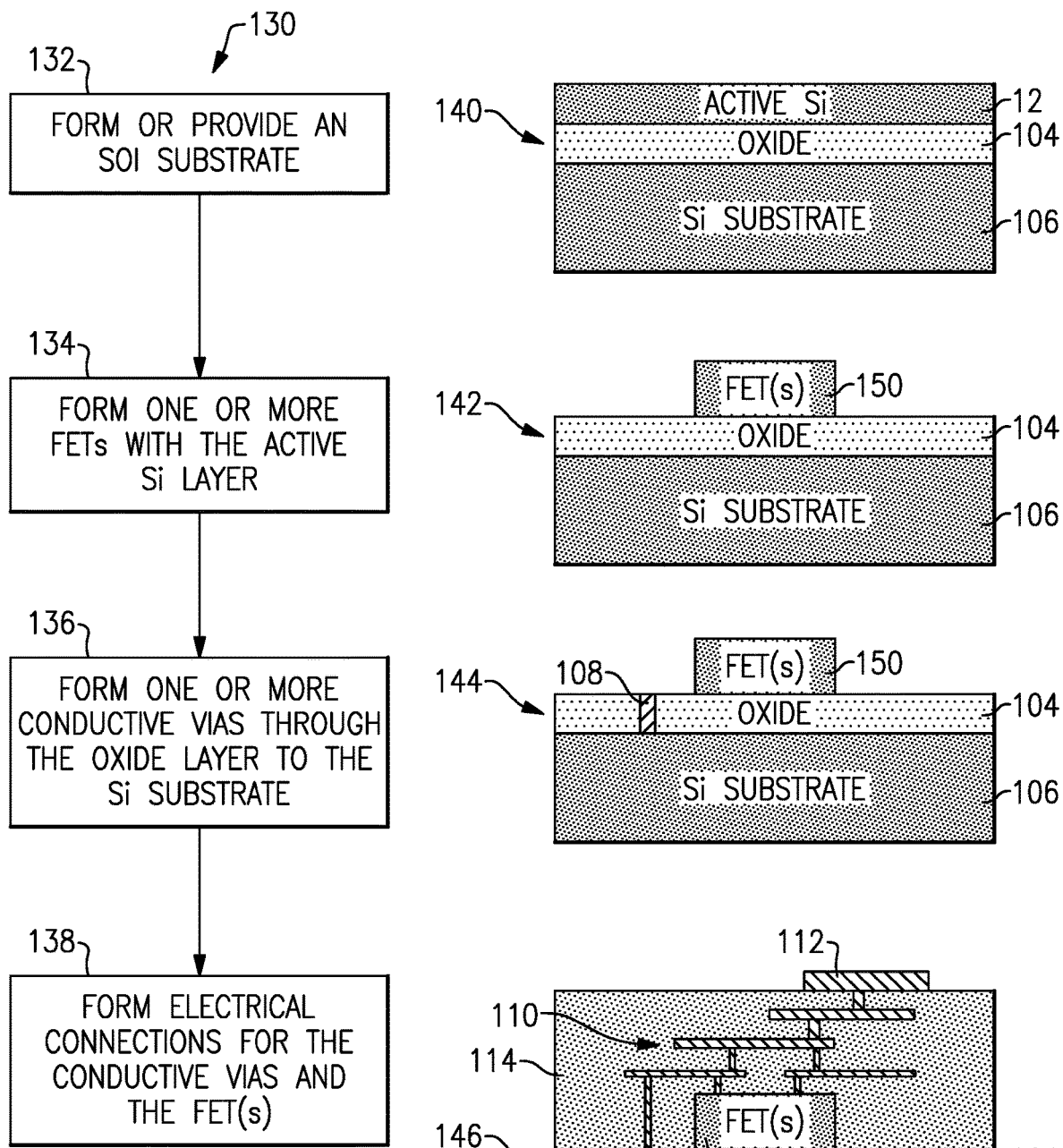
FIG. 11 shows a process that can be implemented to facilitate fabrication of an SOI FET device having one or more features as described herein.
FIG. 12 shows examples of various stages of the fabrication process of FIG. 11.

FIG. 11 shows a process 130 that can be implemented to fabricate an SOI device having one or more features as described herein. FIG. 12 shows examples of various stages of the fabrication process of FIG. 11. In some embodiments, some or all of the various process steps can be implemented utilizing wafer processing technologies.

In some embodiments, fabrication of an SOI device having one or more features as described herein can include fabrication of a wafer having an electrical connection formed between a contact layer and a terminal. An example of a wafer that can be utilized to achieve such a connection between the contact layer and the terminal is shown in FIG. 12 as 146, and examples of process steps in FIG. 11 can be implemented to achieve such a wafer configuration.

In block 132 of FIG. 11, an SOI substrate can be formed or provided. In state 140 of FIG. 12, such an SOI substrate can include an Si substrate 106 such as an Si handle wafer, an oxide layer 104 over the Si substrate 106, and an active Si layer 12 over the oxide layer 104. Such an SOI substrate may or may not have a trap-rich layer (e.g., 14 in FIGS. 9 and 10) between the oxide layer 104 and the Si substrate 106. Similarly, such an SOI substrate may or may not have doped regions (e.g., 117 in FIG. 13) in the Si substrate 106.

In block 134 of FIG. 11, one or more FETs can be formed with the active Si layer. In state 142 of FIG. 12, such a FET is depicted as 150.

In block 136 of FIG. 11, one or more conductive features such as vias can be formed through the oxide layer, to the Si substrate, and relative to the FET(s). In state 144 of FIG. 12, such a conductive via is depicted as 108. As described herein, such an electrical connection through the oxide layer 104 to the Si substrate 106 can also be implemented utilizing other conductive features such as one or more conductive trenches.

In the example of FIGS. 11 and 12, it will be understood that blocks 134 and 136 may or may not be performed in the example sequence shown. In some embodiments, conductive feature(s) such as a deep trench can be formed and filled with poly prior to the formation of the FET(s). In some embodiments, such conductive feature(s) can be formed (e.g., cut and filled with a metal such as tungsten (W) after the formation of the FET(s). It will be understood that other variations in sequences associated with the example of FIGS. 11 and 12 can also be implemented.

In block 138 of FIG. 11, electrical connections can be formed for the conductive vias and the FET(s). In state 146 of FIG. 12, such electrical connections are depicted as a metallization stack collectively indicated as 110. Such a metal stack can electrically connect the FET(s) 150 and the conductive vias 108 to one or more terminals 112. In the example state 146 of FIG. 12, a passivation layer 114 is shown to be formed to cover some or all of the metallization stack 110.

Examples Related to Biasing and/or Coupling of SOI FET Devices

Figure 13:
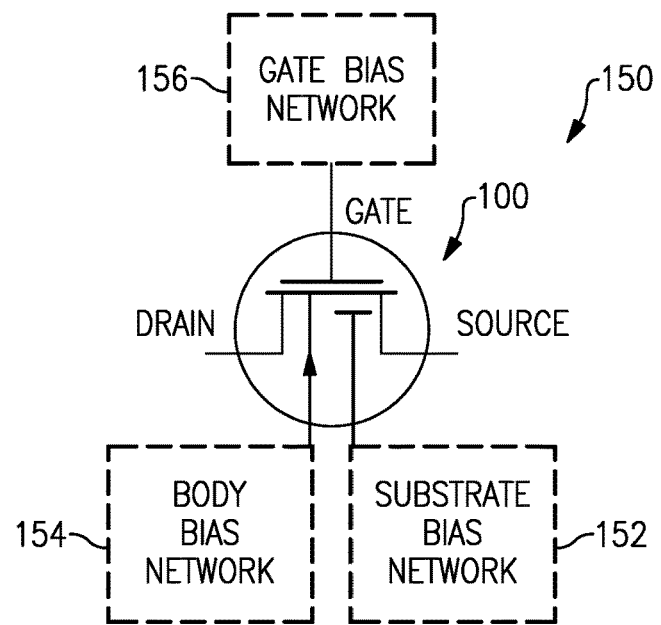
FIG. 13 shows that in some embodiments, an SOI FET device can be biased using one or more bias circuits or devices.

FIG. 13 shows that in some embodiments, an SOI FET device 100 having one or more features as described herein can have its contact layer biased by, for example, a substrate bias network 152, a body bias network 154, and/or a gate bias network 156, represented in the biasing configuration 150 shown. Various examples related to gate bias networks are described herein in greater detail.

In the example of FIG. 13, one or more nodes of the FET device, such as the gate and the body of the FET device 100 can be biased by their respective networks. Among others, examples related to such gate and body bias networks can be found in PCT Publication No. WO 2014/011510 entitled CIRCUITS, DEVICES, METHODS AND COMBINATIONS RELATED TO SILICON-ON-INSULATOR BASED RADIO-FREQUENCY SWITCHES, the disclosure of which is hereby expressly incorporated by reference herein in its entirety.

Figure 14:
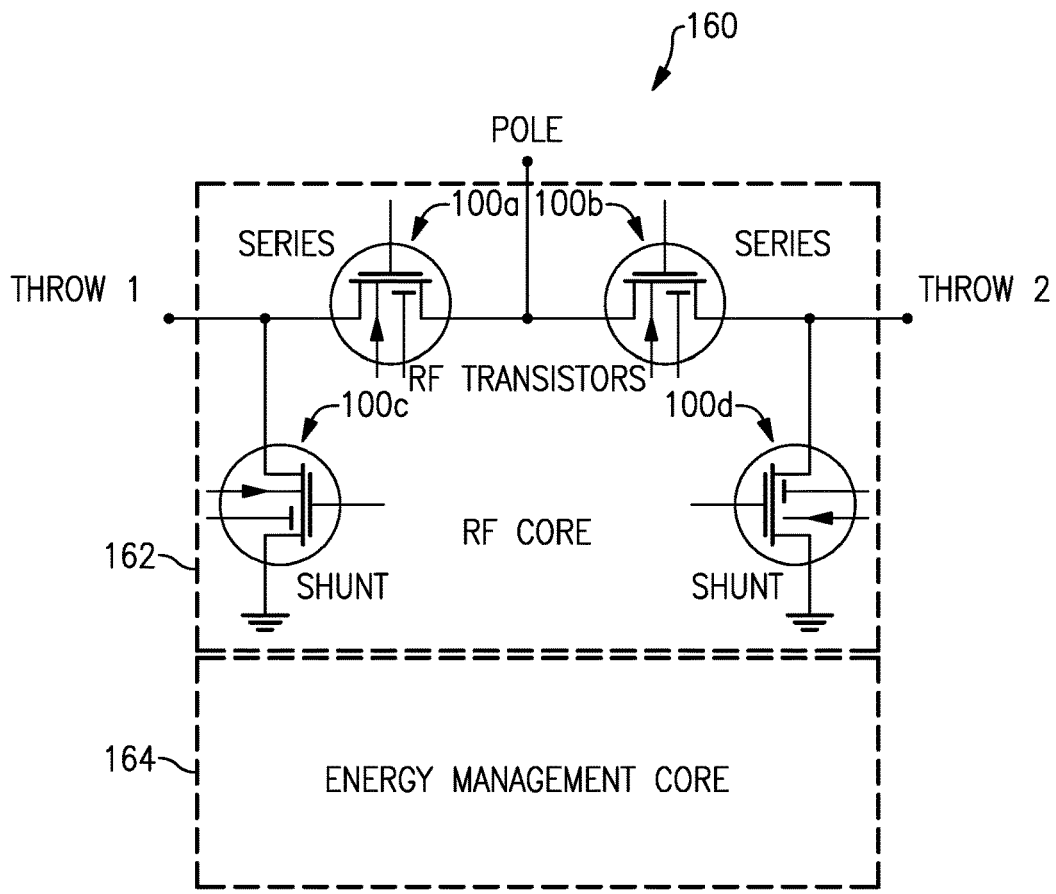
FIG. 14 shows an example of a radio-frequency (RF) switching configuration having an RF core and an energy management (EM) core.
Figure 15:
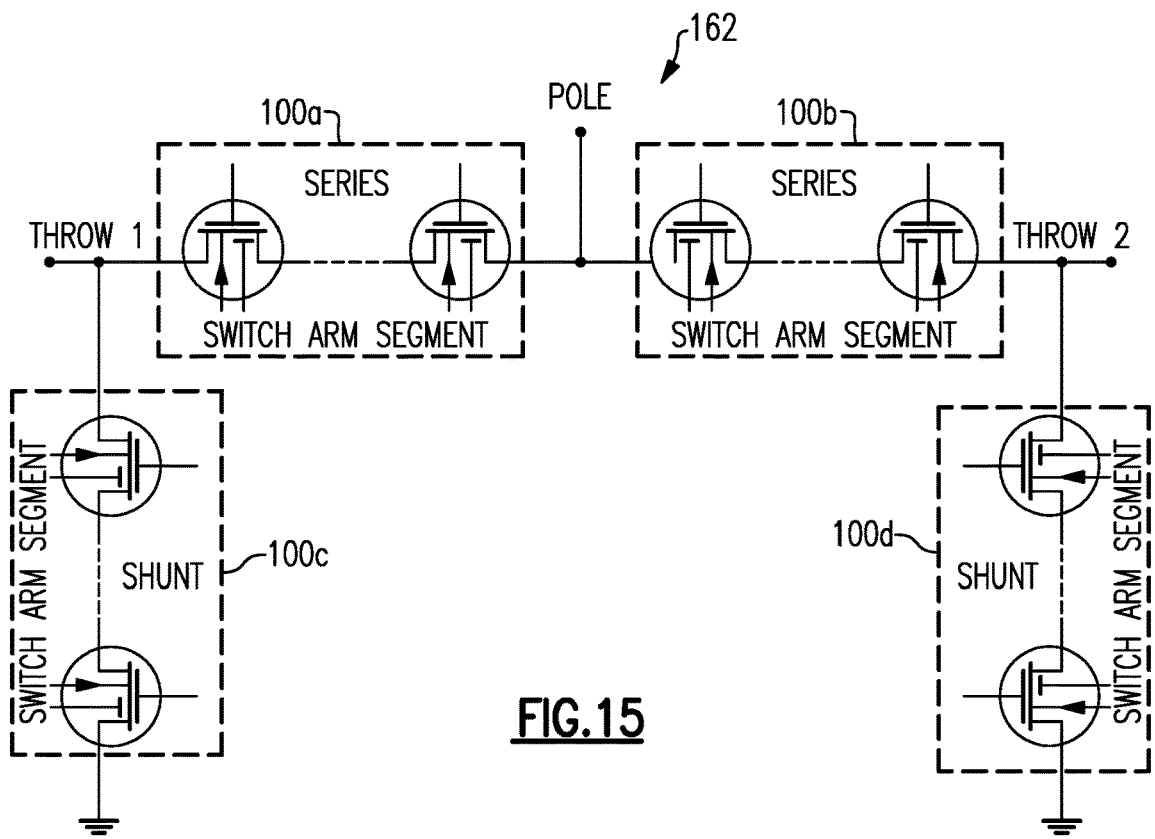
FIG. 15 shows an example of the RF core of FIG. 14, in which each of the switch arms includes a stack of FET devices.
Figure 16:
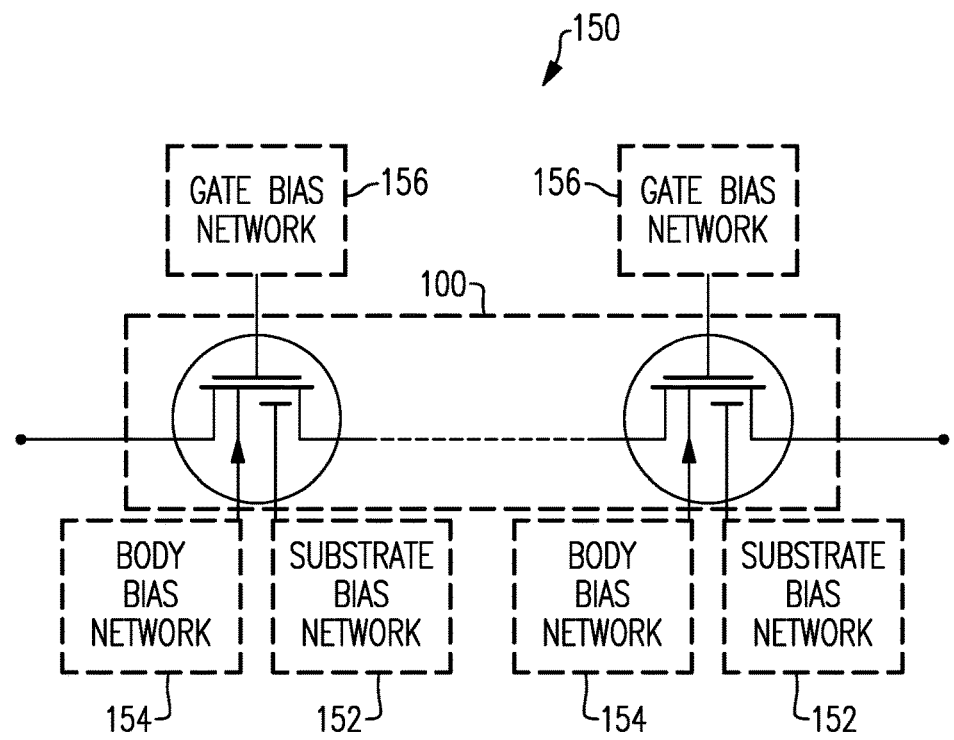
FIG. 16 shows an example of the biasing configuration implemented in a switch arm having a stack of FETs in accordance with one or more embodiments.

FIGS. 14-16 show that in some embodiments, SOI FETs having one or more features as described herein can be implemented in RF switching applications.

FIG. 14 shows an example of an RF switching configuration 160 having an RF core 162 and an energy management (EM) core 164. Additional details concerning such RF and EM cores can be found in the above-referenced PCT Publication No. WO 2014/011510. The example RF core 162 of FIG. 14 is shown as a single-pole-double-throw (SPDT) configuration in which series arms of transistors 100a, 100b are arranged between a pole and first and second throws, respectively. Nodes associated with the first and second throws are shown to be coupled to ground through their respective shunt arms of transistors 100c, 100d.

In the example of FIG. 14, some or all of the transistors 100a-100d can include contact layers as described herein. Such contact layers can be utilized to provide desirable functionalities for the corresponding transistors. Furthermore, the gates of one or more of the transistors 100a-100d may be biased using a manifolded gate resistor network, as described in detail below.

FIG. 15 shows an example of the RF core 162 of FIG. 14, in which each of the switch arms 100a-100d includes a stack of FET devices. For the purpose of description, each FET in such a stack can be referred to as a FET, the stack itself can be collectively referred to as a FET, or some combination thereof can also be referred to as a FET. In the example of FIG. 15, each FET in the corresponding stack may have one or more contact layers as described herein. It will be understood that some or all of the FET devices in the RF core 162 can include such contact layers. Furthermore, some or all of the FET devices of the RF core 162 can be coupled at respective gate(s) to one or more manifolded gate resistance networks, as described herein.

FIG. 16 shows an example of the biasing configuration 150 of FIG. 13, implemented in a switch arm having a stack of FETs 100 as described in reference to FIG. 15. In the example of FIG. 16, each FET in the stack can be biased with a separate gate bias network 156, the FETs in the stack can be biased with a plurality of substrate bias networks 156, all of the FETs in the stack can be biased with a common substrate bias network, or any combination thereof. Such possible variations can also apply to substrate biasing (152) and body biasing (154).

Manifolded Gate Resistance Network

As referenced above, the performance and/or electrostatic discharge (ESD) strike limit for certain integrated switch devices/module may at least partially determined by the electrical isolation of transistor stacks in series and/or shunt arms of the switch(es). For example, with respect to ESD protection, the shunt arm(s) of a radio-frequency (RF) switch may have a substantial influence due at least in part to the lack of protection for such components by, for example, diode and/or voltage clamping devices and structures. That is, although certain other smaller devices in the analog energy management core circuitry associated with the switch may have ESD diode and/or clamping devices or structures associated therewith, the inclusion of such structures on the pads of an RF switch interface may result in inferior RF performance due at least in part to the associated parasitic capacitances.

Figure 17:
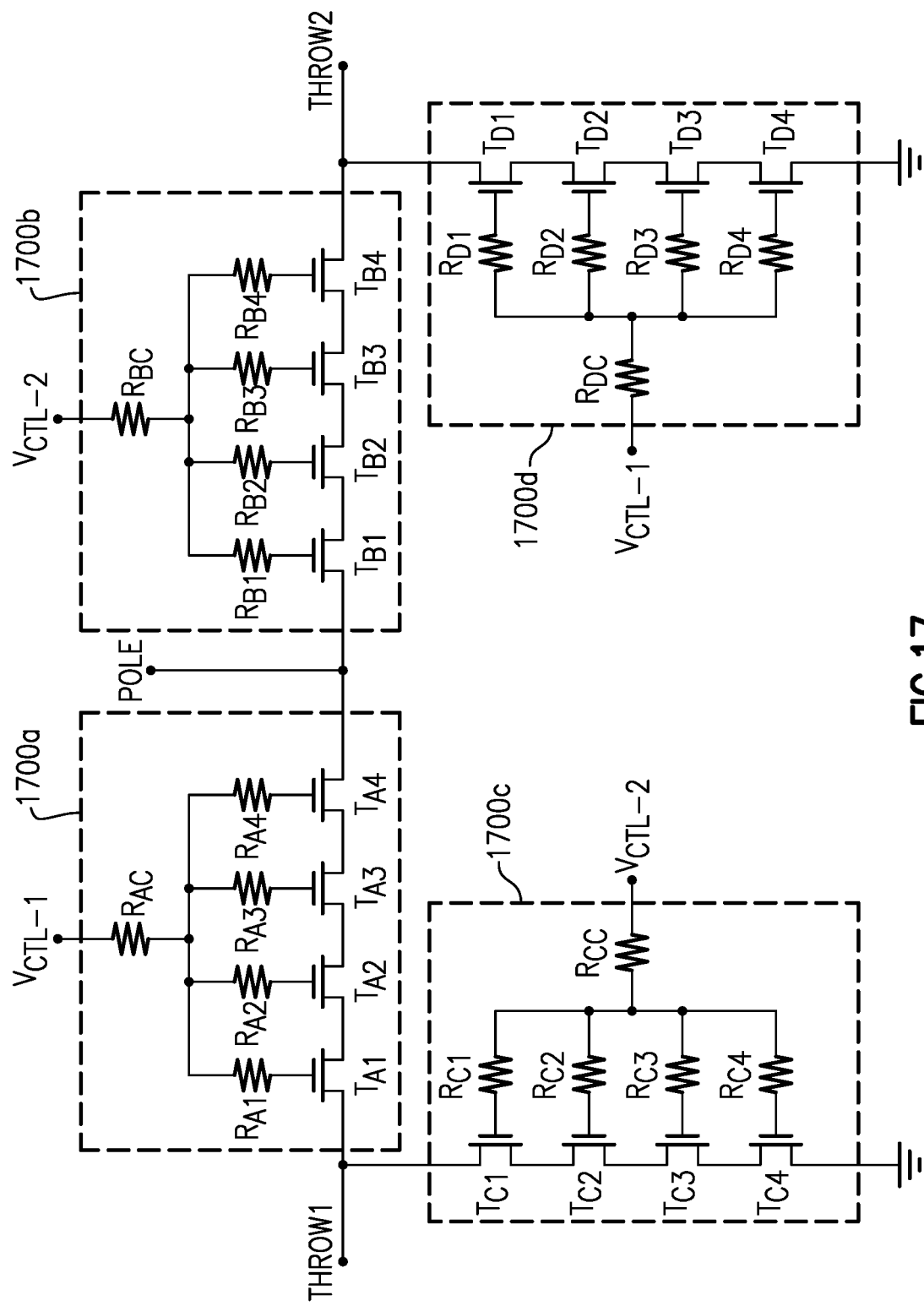
FIG. 17 shows a single-pole-double-throw configuration of an RF core of a switching circuit in accordance with one or more embodiments.

ESD performance in a switch device/module may be improved in various ways. For example, by strengthening the RF shunt device(s), thereby making them more robust to ESD, ESD performance may be improved. Furthermore, according to certain embodiments, ESD performance may be improved by reducing the ESD voltage seen across each transistor in the transistor stack of the shunt arm(s) of the switch. In some implementations, shunt transistors (e.g., field-effect transistors) may be formed using a longer than minimum gate length for improved ESD performance, though such solutions may be associated with reduced RF performance with respect to a fixed layout area due to an increase in the ON-resistance of the transistors. Decreasing the stack count (i.e., the number of transistors in series) of the shunt transistor stack may also strengthen the resistance of the stack to ESD by reducing the voltage experienced by first device in the stack, which may generally represent the device of the transistor stack most susceptible to failure. However, such solutions may also come at the expense of reduced radio-frequency performance, particularly at higher frequencies, due to higher OFF-capacitance and increased current leakage through the shunt stack when turned off. Furthermore, lower stack count can result in lower isolation and/or higher insertion loss. FIG. 17 provides an example single-pole-double-throw configuration of a radio-frequency (RF) core 1760 of a switching circuit that may be at least partially susceptible to electrostatic discharge (ESD). The RF core 1760 is shown to include a single pole coupled to first and second throw nodes (Throw 1, Throw 2) via first 1700a and second 1700b transistor stacks (e.g., FET stacks).

The first throw node (Throw 1) is shown to be coupled to a RF ground reference via a transistor stack 1700c to provide shunting capability for the first throw node. Similarly, the second throw node (Throw 2) is shown to be coupled to a RF ground reference via a transistor stack 1700d to provide shunting capability for the second throw node. The first and second throw nodes may further each be coupled to a RF signal associated with a separate RF transmission band in certain embodiments.

In an example operation, when the RF core 1760 is in a state where an RF signal is being passed between the pole and the first throw node, the transistor stack 1700a between the pole and the first throw node can be in an ON state, and the transistor stack 1700b between the pole and the second throw node can be in an OFF state. For the shunt transistors 1700c, 1700d, the shunt stack 1700c can be in an OFF state so that the RF signal is not shunted to ground as it travels from the pole to the first throw node, while the shunt stack 1700d associated with the second throw node can be in an ON state so that any RF signals or noise arriving at the RF core 1760 through the second throw node is shunted to the ground so as to reduce undesirable interference effects to the pole-to-first-throw operation.

Although the foregoing example is described in the context of a single-pole-double-throw configuration, it will be understood that the RF core 1760 can be configured with other numbers of poles and throws. For example, there may be more than one poles, and the number of throws can be less than or greater than the example number of two. Furthermore, in certain contexts, the transistor stacks 1700a, 1700b may be considered series arms, or series transistors/transistor stacks, of the RF core 1760, while the transistor stacks 1700c, 1700d may be considered shunt arms, or shunt transistors/transistor stacks, of the RF core 1760. Each of the illustrated transistor stacks may include any number of transistors (e.g., field-effect transistors) connected in series.

Each of the transistors of the various series and shunt transistor stacks of the RF core 1760 may be controlled by one or more control signals provided by an associated energy management core. For example, the drain, source, gate and/or body nodes of the various series and/or shunt devices may be biased from the energy management core. In certain embodiments, the switch 1760 may be cross-biased, wherein transistor gates are driven to a logic high value (e.g., 2.5 V) to turn on the associated switch arm, while the drains and sources are driven to a logic low (e.g., 0 V), which may provide desirable transistor turn-on and relatively low resistance for the switch. To turn off the switch arm, the transistors may be cross-biased, wherein the gates are driven to a logic low (e.g., 0 V) and the drains/sources are driven up to a logic high (e.g., 2.5 V), to provide a −2.5 V gate-to-source voltage for the transistors. In cross-biasing configurations, the switch 1760 may include blocking capacitors between certain of the drains and sources of the switches so that each of the switch arms may be cross-biased in an ON-state without affecting the voltage of a switch that shares a common connection. For example, in certain embodiments, a blocking capacitor may be disposed between the shunt stack 1700c and the first throw node (Throw 1), as well as between the series stack 1700a and the pole, such that when the shunt stack 1700c is in an ON-state, it's drain-to-source voltages may be brought to 0 V while the series stack 1700a is in an OFF-state, with a drain-to-source voltage of, for example, 2.5 V, or other value. In certain embodiments, transistor gates may be switched between a logic high value (e.g., 2.5 V) and a negative logic low value (e.g., −2.5 V), which may obviate the need for certain blocking capacitors due to the drain-to-source voltages of the various transistors being maintained at around 0 V regardless of the polarity of the transistors.

The pole node of the radio-frequency (RF) core 1760 may be considered a common port to the first and second throw nodes. As described above, the shunt arms 1700c, 1700d may be used to shunt a respective unused RF path to ground. In certain embodiments, the polarities of cross switch arms may be controlled by a common control signal, or may otherwise be maintained in a common state. For example, in certain embodiments, the series arm 1700a and the cross-oriented shunt arm 1700d may be controlled by a common control signal (e.g., $V_{CTL-1}$), or otherwise maintained in the same logic state, while the series arm 1700b and the cross-oriented shunt arm 1700c may be controlled by a common control signal (e.g., $V_{CTL-2}$), or otherwise maintained in the same logic state. During operation of the switch 1760, the control signals from the energy management core may be configured such that when one of the control signals (e.g., $V_{CTL-1}$ or $V_{CTL-2}$) is set to a logic high, the other is set to a logic low.

As described above, where a certain signal is desired to be transmitted to the pole (e.g., antenna node), the path between the associated throw and the pole may be biased ON, while other switches not being currently used will be biased OFF. Furthermore, shunt arms associated with the OFF arm(s) may be connected to ground to further isolate the path of interest. However, where a series transistor stack (e.g., 1700a, 1700b) is disposed in the transmit arm between the pole node and the respective shunt arm, linearity issues may arise based on harmonics and/or intermodulation that may be generated by the series transistors transmitting the signal of interest in the ON arm, as well as the voltage swing that may be present in the OFF arm(s). Therefore, isolation of series transistor stacks can affect linearity performance of the switch 1760.

When radio-frequency (RF) signal is being driven from the pole through one of the throw nodes, coupling of the RF signal onto the gate control signal node (e.g., $V_{CTL-1}$ or $V_{CTL-2}$) may result, particularly for relatively higher frequency signals. Therefore, it may be desirable to implement resistive isolation between the gates of the series transistor stacks and the control signal nodes. Such isolation may be achieved at least in part through the use of resistive networks coupled to the gates of the stack transistors. For example, the series stack 1700a may be isolated using local gate resistors $R_{A1-A4}$, which may be coupled to the control node $V_{CTL-1}$ through a common resistor $R_{AC}$, which may be common to the whole stack 1700a. The common resistor $R_{AC}$ may serve to provide isolation back to the control circuit, while the local resistors $R_{A1-A4}$ may serve to provide isolation between gates of the individual transistors of the stack.

With respect to electrostatic discharge (ESD) events, high drain-to-gate voltages may result, and so it may be desirable for the drain-to-gate voltage of, for example, the first device in a transistor stack (e.g., shunt transistors $T_{C1}$, $T_{D1}$) to be reduced to allow such devices to tolerate relatively higher ESD events without sustaining serious damage. For switching circuitry/modules, the switch may share an antenna (e.g., coupled to the pole of FIG. 17) between transmit and receive nodes (e.g., Throw 1, Throw 2); where the pole represents an antenna connection, such node may be at least partially exposed to external environmental conditions and/or systems. For example, an antenna port may represent an interface to human or other physical interaction, which may present risk of ESD exposure. ESD events for a switching module may occur in connection with device assembly and/or manufacturing, such as test probe interaction or the like. In certain implementations, the shunt arm(s) of a switch provide the ESD path for RF core circuitry of a switching system.

In some implementations, integrated circuit components may be protected from damage due to ESD events through the use of one or more diodes between ground references and external interface ports, or through the use of one or more power clamps across, for example, battery and/or ground connections. However, with respect to RF switch ports or other RF ports associated with a transmission signal of interest, the use of diodes may cause undesirable losses due to the function of diodes at relatively high frequencies operating similar to a short to ground. That is, while the analog energy management core circuitry of a switch die may comprise relatively smaller devices that are protected by ESD diodes and/or clamping structures, the inclusion of such circuits on the pads for the RF core circuitry may cause inferior RF performance due to the associated parasitic capacitances. Therefore, it may not be practical or desirable to use diode ESD protection for RF switching circuits like the switching RF core 1760 of FIG. 17. For RF switches, the shunting arms' ability to tolerate relatively large voltage current to handle electrostatic discharge may determine the circuit's ability to handle ESD events. In certain implementations, therefore, ESD tolerance in an RF switching circuit may be improved through the use of relatively more robust shunt devices.

Certain embodiments disclosed herein provide for manifolded resistance networks for transistor stacks in switching circuits to provide for reduced drain-to-gate voltages in certain transistor devices thereof. As used herein, the term "manifolded" is used according to its broad and/ordinary meaning, and may be used to describe resistance networks including local gate resistors coupled to the gates of each resistor of a transistor stack, a common resistor common to the transistors of the stack, and at least one intermediate level of resistances common to some, but not all, of the transistors in the stack. Manifolded resistance networks may have a tree-like topology, wherein each of the stack transistors represents a leaf in a tree structure, and the control node represents a root of the tree structure, wherein the tree structure includes at least one intermediate level comprising a plurality of intermediate nodes, each intermediate node being coupled to two or more of the transistors of the stack. Some or all of the nodes of the tree (e.g., transistor gates, lower-level connection nodes, common control node) may be associated with a resistance that is local to the node and/or directly connected thereto. Therefore, "manifolded" resistance networks may be understood in the context of the present disclosure to refer to the separate coupling of groups of transistors of a transistor stack, and the further common coupling of the separate groups of transistors, through one or more additional coupling paths and/or levels, to a common control node. Manifolded gate resistance networks as described below may represent configurations and/or embodiments of gate bias networks, or portions thereof, as shown in FIGS. 13 and 16 and described above.

In addition to providing certain ESD benefits, manifolded gate resistance networks according to the present disclosure may improve switch linearity. For example, increasing linearity in the gate resistance architecture of FIG. 17, which includes one common resistor coupled to many individual gate resistors, may require an increase in the resistances and the common and/or local gate resistors. Such an increase in resistance may improves OFF-resistance (ROFF), lower insertion loss, and/or move up the compression point. However, the improvements may be obtained at the expense of increasing switching speed due to a greater RC time constant, where 'C' represents the capacitance of the gates in the switches, looking into the common gate control node at the common resistor. Certain embodiments disclosed herein provide for improved linearity, and maintained switching speed (e.g., RC time constant), without requiring an increase in resistance of the gate resistance network through the use of manifolded gate resistance network(s). According to certain embodiments, manifolded gate resistance networks may provide higher OFF-resistance (ROFF) looking into the drain of the switch stack, better linearity, reduced loss, and/or other benefits, while maintaining a desired switching speed.

Figure 18:
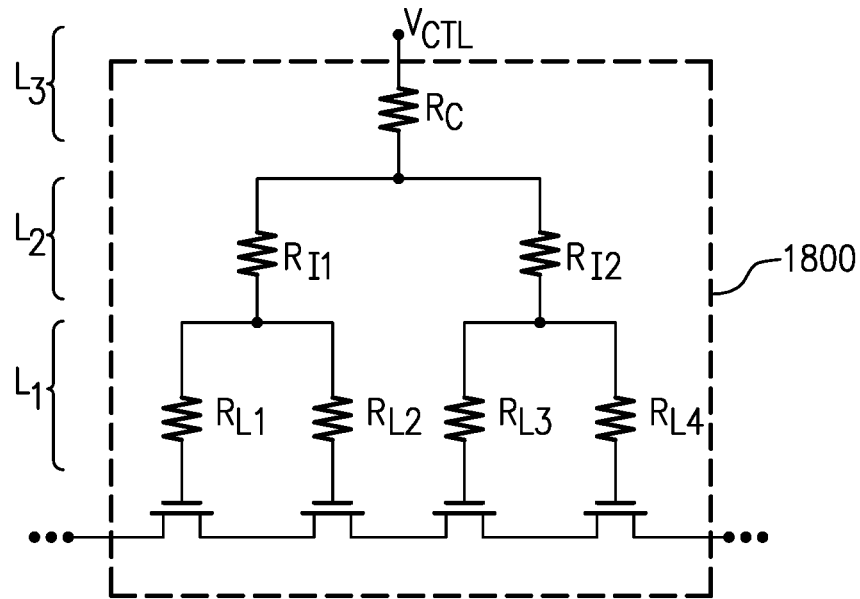
FIG. 18 shows a transistor stack having transistors isolated by a manifolded gate resistance network in accordance with one or more embodiments.

FIG. 18 illustrates a transistor stack 1800 comprising a plurality of transistors $T_{1-4}$ connected in series, wherein the transistors of the transistor stack are isolated by a manifolded gate resistance network. For example, rather than utilizing a resistance network in which the local gate resistances $R_{L1-L4}$ of the transistors are directly connected to a common control node resistance $R_C$, which may provide isolation of the stack from an AC perspective, the gate resistance network of FIG. 18 comprises a relatively more progressive fan-out of the isolation resistance by adding more branches to the resistor tree. That is, while the resistance networks of FIG. 17 include a single trunk directly coupled to a plurality of leaf nodes associated with the respective transistor gates, the resistance network of FIG. 18 includes a trunk node at a first level $L_1$ connected to individual gate resistances disposed at a third level $L_3$ of the tree structure via one or more intermediate connecting resistance levels $L_2$. In certain embodiments, the network of FIG. 18 may comprise resistors selected to provide similar RF performance to the more basic resistance structure shown in FIG. 17, while the voltage developed across the top device in the stack (e.g., $T_1$ or $T_2$, depending on orientation/connection of the stack 1800) may be substantially reduced. In certain embodiments, each of the resistors in the circuit 1800 may have a value of approximately 9 kOhm, or some other value. The configuration of the resistance network 1800 may provide improved ESD performance.

In manifolded resistance networks in accordance with the the present disclosure, transistors of a transistor stack comprising at least three transistors connected in series may each be coupled to at least one neighboring transistor transistor stack. For example, while each transistor transistor stack may be coupled to at least one of the transistor of the stack, in certain embodiments, manifolded resistance networks may be configured such that, each individual transistor may be coupled to a neighboring transistor, while not being directly coupled to at least one of the transistors of the transistor stack.

For example, with respect to the four-transistor stack 1800 of FIG. 18, each of the four transistors $T_{1-4}$ may have an associated gate resistance directly coupled to the respective gate. Therefore, as shown in FIG. 18, the network 1800 may include a first gate path 1804 coupled to a second gate path 1803, thereby connecting first and second transistors $T_1$, $T_2$ of the transistor stack. Furthermore, the third transistor $T_3$ may include a gate path 1802 coupled to the gate path 1801 of the fourth transistor $T_4$, each of the gate paths 1802, 1801 having a resistance associated therewith. The network 1800 further includes an intermediate coupling path associated with a second level $L_2$ of the network. For example, the intermediate coupling path may comprise a first coupling path 1805 connected to the first and second gate paths 1804, 1803 at a node $N_1$ disposed between the resistance RD of the first gate coupling path 804 and the resistance $R_{L2}$ of the second gate coupling path 1803. The intermediate coupling path may couple the combined first and second gate coupling paths 1804, 1803 with the combined third and fourth gate coupling path 1802, 1801, as shown. The intermediate coupling path (1805, 1806) may include two local resistances $R_{l1}$, $R_{l2}$, wherein a common voltage control path 1807 may be connected to the intermediate coupling path at a node $N_3$ disposed between the first resistance $R_{l1}$ and the second resistance $R_{l2}$ of the intermediate coupling path (1805, 1806). The connection path 1807 further comprise a resistance $R_C$ associated therewith. Although FIG. 18 shows a common voltage control node $V_{CTL}$ connected to the intermediate coupling path 1805, 1806, it should be understood that the resistance tree network of FIG. 18 may represent a portion of a larger manifolded resistance network, wherein the connection path 1807 may further be connected to another subsection/sub-tree (not shown) of a larger resistance network, wherein the network may comprise one or more additional intermediate layers, and wherein transistors of the transistor stack maybe coupled to one another directly, while being coupled to other transistors of the stack only in an indirect fashion through one or more intermediate coupling paths between a top layer of the tree and an end level of the tree (e.g. comprising transistor gate leaf nodes of the tree structure).

For example, with respect to a three-transistor transistor stack, in an embodiment, first and second transistors of the stack may be coupled together, each of the first and second transistors having a local gate resistor associated therewith, while a third transistor, also including a local gate resistance, may not be directly coupled to the first and second transistors, but may instead be coupled through an intermediate level of the transistor network tree to the coupled first and second transistors. For example, the intermediate level of the resistance network tree may be connected to the coupling path connecting the first transistor to the second transistor at a node between a gate resistor of the first transistor and a gate resistor second transistor, wherein the intermediate coupling path includes a resistance associated therewith. The intermediate coupling path may further be coupled to a common control node. The common control node may be connected to the intermediate coupling path at a node connected between the local resistance of the coupling path and the gate resistance of third transistor.

Figure 19:
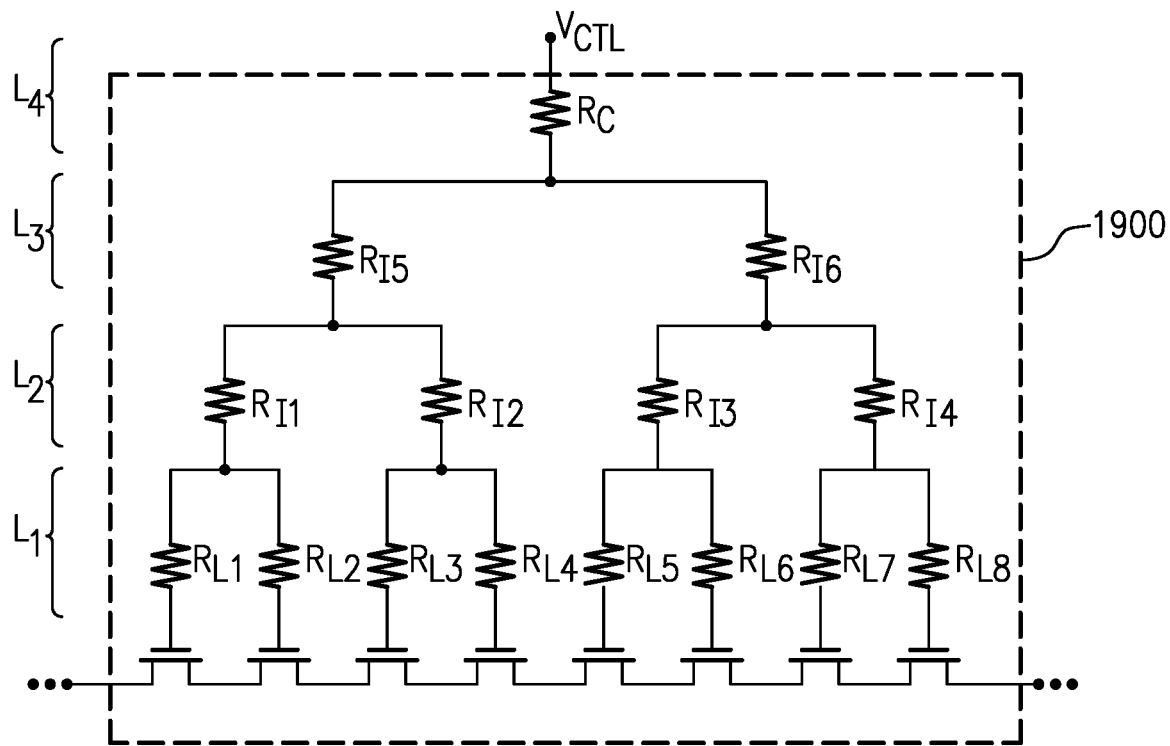
FIG. 19 shows a manifolded resistance network for a transistor stack in accordance with one or more embodiments.

In certain embodiments, manifolded resistance networks in accordance with the present disclosure may comprise at least three levels of nodes and/or resistances, as shown in FIGS. 18 and 19, and described in detail herein, with one or more of the levels being intermediate coupli-ng levels. For example, the network of FIG. 18 may comprise a tri-fold resistance network, while FIG. 19 may provide an example of a four-fold resistance network.

The architecture of FIG. 18, as well as certain other embodiments of manifolded gate resistance networks in accordance with the present disclosure, may provide improved OFF-resistance ($R_{OFF}$). High $R_{OFF}$ can be beneficial with respect to linearity performance in radio-frequency switches. For example, switches having OFF devices with relatively low $R_{OFF}$ may experience poor linearity performance due to the leakage of signal from the OFF devices and lowering peak signal voltage swing. In certain embodiments, higher $R_{OFF}$ may result in reduced dissipation of power, lower insertion loss, and better linearity.

Compared to the various gate resistance networks of FIG. 17, which may have an OFF-resistance ($R_{OFF}$) of approximately 15 kOhm in some embodiments, the gate resistance network 1800 of FIG. 18 may have a substantially higher $R_{OFF}$, such as approximately 25 kOhm in some embodiments. That is, the network 1800 may provide improved $R_{OFF}$ in a switching circuit for a given area of resistors. Furthermore, compared to the gate resistance networks of FIG. 17 implemented with larger resistors, the network 1800 may provide increased $R_{OFF}$ while substantially maintaining switching speed (e.g., RC time constant), whereas the networks of FIG. 17 may be associated with higher switching speeds.

The architecture of FIG. 18, as well as certain other embodiments of manifolded gate resistance networks in accordance with the present disclosure, may provide improved OFF-device voltage handling compared to certain alternative solutions. Voltage handling, as described herein, may refer to a measure of a device's ability to handle radio-frequency (RF) incident power before breakdown occurs. Generally, higher voltage handling may result in improved linearity performance and/or maintenance of signal peaks. In certain embodiments, the network 1800 of FIG. 18 may have a voltage breakdown up to 2 volts, or more, higher than certain alternative architectures. For example, the network 1800 may have a compression point that is up to 1 dB, or more, higher than certain alternative architectures, which may prevent higher strength/amplitude signals to be switched, while providing improved harmonic performance even at backed off power levels (e.g., below P1 dB) where the switch is may be subject to reduced stress.

FIG. 19 shows a manifolded resistance network for a transistor stack 1900 comprising eight transistors connected in series. It should be understood that the manifolded resistance networks illustrated FIGS. 18 and 19, as well as other manifolded resistance networks incorporating features of the networks shown in FIGS. 18 and 19, may be incorporated in series and/or shunt arms of a switching circuit or device/module.

The manifolded resistance network of FIG. 19 represents a network comprising more than one intermediate coupling level, wherein groups of coupled gate resistances may be joined together through intermediate coupling in the levels $L_2$ and $L_3$. Although the network of FIG. 19 shows pairs of transistor gates being directly coupled to one another, and further coupled to other pairs of transistor gates through intermediate coupling levels, it should be understood that certain embodiments may be implemented in which three, four, or some other number of transistor gates may be directly coupled. For example, in one embodiment, transistors $T_{1-4}$ may be directly coupled, whereas transistors $T_{5-8}$ may also be directly coupled to one another, wherein the sub-groups of four directly-coupled transistor gates may be coupled to one another through a single intermediate coupling level, rather than the dual-level solution shown in FIG. 19, the intermediate coupling level or path being connected to a common voltage control line having a common resistor associated therewith. Certain embodiments of the present disclosure may comprise at least three levels of resistances, including a common resistor Rc at a first level, as well as a level of local gate resistances (e.g., level $L_3$ in FIG. 18 and level $L_4$ in FIG. 19).

It should be understood that the networks of FIGS. 18 and 19 represent example networks, and manifolded gate resistance networks in accordance with the present disclosure may comprise transistor stacks having any number of transistors, as well as any configuration of direct coupling of gate resistances, as well as any number of intermediate resistance coupling levels. For example, in some embodiments, a transistor stack comprising six transistors may be associated with a manifolded gate resistance network. For example, in a six-transistor stack, transistor gate resistances may be directly coupled to one another in groups of two transistors, three transistors, or some other grouping. Where pairs of transistors are directly coupled, the resulting three pairs of coupled gate resistances may be further coupled together in an intermediate level, wherein the intermediate level is further coupled to the common control node and common resistance. In an alternative configuration, a six-transistor stack may be coupled in groups of three, wherein two separate groups of three transistors may be directly coupled via gate connections, wherein the two separate direct gate couplings may be coupled to one another through an immediate level connection, which may further be connected to a voltage control node and resistance.

Figure 20:
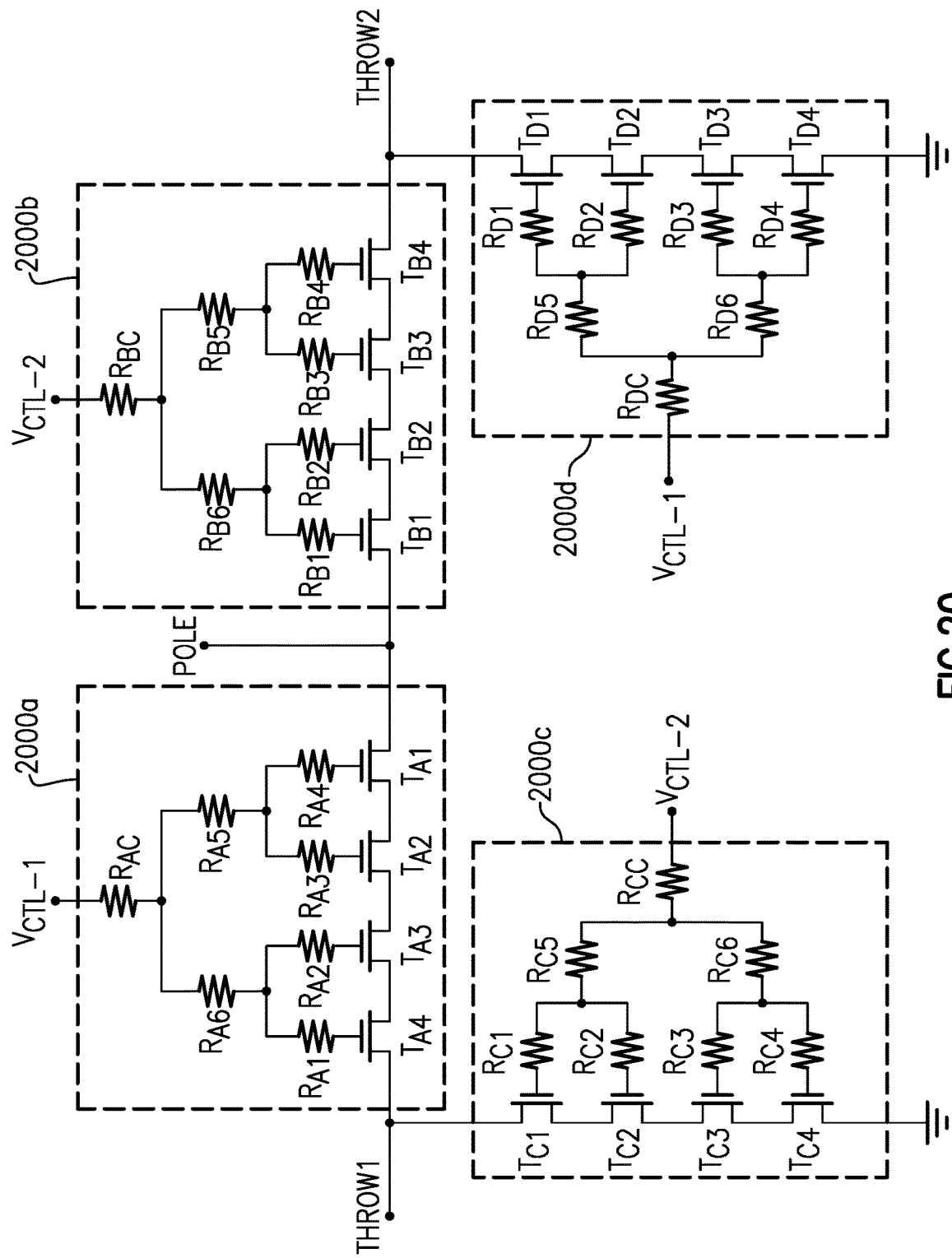
FIG. 20 shows an RF core in accordance with one or more embodiments.

FIG. 20 illustrates an embodiment of a radio-frequency (RF) core 2060 comprising a pole connected to two throw nodes (Throw 1, Throw 2) through respective series arm transistor stacks 2000a, 2000b. The circuit 2060 further includes shunt arms connecting the respective series arms to a ground reference through respective transistor stacks 2000c, 2000d. The circuit 2060 illustrates that transistor stacks of an RF core for a switching device may be associated with manifolded gate resistance networks as described above. Although manifolded gate resistance networks are illustrated as being associated with each of the series arms as well as the shunt arms, it should be understood that manifolded gate resistance networks may be associated with only a sub set of the transistor stacks of the circuit 2060, such with only the shunt arms, with only the series arms, or a subset of the series and/or shunt arms. Furthermore, it should be understood that the transistor stacks of the circuit 2060 may have any number of transistors, intermediate resistance coupling levels, and/or configuration of manifolded gate resistance networks.

In certain embodiments, it may be desirable to implement manifolded gate resistance networks in connection with the shunt arms of the circuit 2060 in order to improve ESD tolerance. For example, where an ESD event occurs between one of the throw nodes and the ground reference, the path to ground for the ESD current may be at least partially through the associated shunt arm. Therefore, the shunt arm(s) may be relied up to handle the ESD voltage. The manifolded gate resistance network may serve to at least partially reduce the voltage experienced by the top device (e.g., TC1, TD1) in the shunt stack, thereby increasing the ESD limit for the switch 2060.

In certain embodiments, it may be desirable to implement manifolded gate resistance networks in connection with series arms of the circuit 2060 in order to improve linearity performance. For example, in some implementations, the implementation of manifolded gate resistance networks may improve linearity by approximately 2-3 volts. The manifolded gate resistance of the series stack(s) may help to hold the transistor (e.g., FET) drain-to-source voltage at a desirable level due to a decrease in leakage from drain-to-gate when power is transmitted. Therefore, the series transistor stack(s) may have better breakdown performance.

Examples Related to Switch Configurations

As described herein in reference to the examples of FIGS. 29, 30 and 33-37, FET devices having one or more features of the present disclosure can be utilized to implement an SPDT switch configuration. It will be understood that FET devices having one or more features of the present disclosure can also be implemented in other switch configurations.

Figure 21:
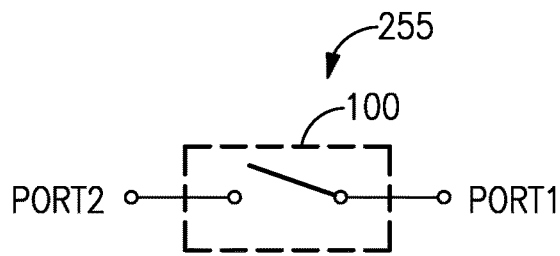
FIG. 21 shows a switch assembly implemented in a single-pole-single-throw (SPST) configuration utilizing an SOI FET device.

FIGS. 21-31 show examples related to various switch configurations that can be implemented utilizing FET devices such as SOI FET devices having one or more features as described herein. For example, FIG. 21 shows a switch assembly 255 implemented in a single-pole-single-throw (SPST) configuration. Such a switch can include an SOI FET device 100 implemented between a first port (Port1) and a second port (Port2).

Figure 22:
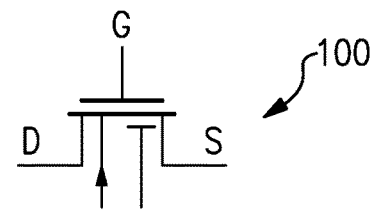
FIG. 22 shows that in some embodiments, the SOI FET device of FIG. 21 can include a conductive layer feature as described herein.

FIG. 22 shows that in some embodiments, the SOI FET device 100 of FIG. 21 can include a contact layer feature as described herein. The source node of the SOI FET device 100 can be connected to the first port (Port1), and the drain node of the SOI FET device 100 can be connected to the second port (Port2). As described herein, the SOI FET device 100 can be turned ON to close the switch 255 (of FIG. 21) between the two ports, and turned OFF to open the switch 250 between the two ports.

It will be understood that the SOI FET device 100 of FIGS. 21 and 22 can include a single FET, or a plurality of FETs arranged in a stack. It will also be understood that each of various SOI FET devices 100 of FIGS. 23-31 can include a single FET, or a plurality of FETs arranged in a stack.

Figure 23:
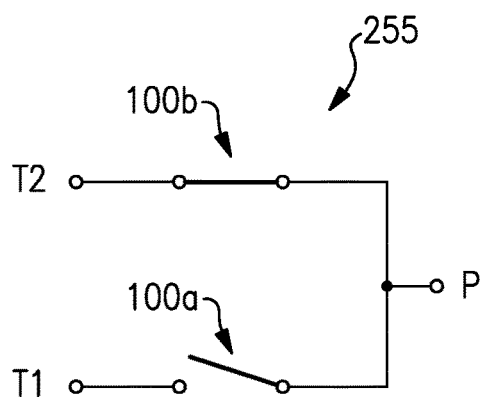
FIG. 23 shows an example of how two SPST switches having one or more features as described herein can be utilized to form a switch assembly having a single-pole-double-throw (SPDT) configuration.
Figure 24:
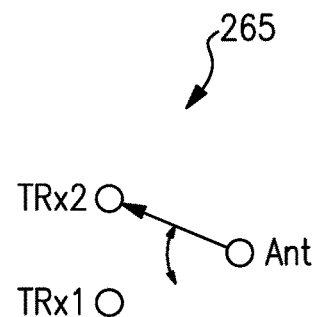
FIG. 24 shows that the switch assembly of FIG. 23 can be utilized in an antenna switch configuration.

FIG. 23 shows an example of how two SPST switches (e.g., similar to the examples of FIGS. 21, 22) having one or more features as described herein can be utilized to form a switch assembly 255 having a single-pole-double-throw (SPDT) configuration. FIG. 24 shows, in a SPDT representation, that the switch assembly 255 of FIG. 23 can be utilized in an antenna switch configuration 228. It will be understood that one or more features of the present disclosure can also be utilized in switching applications other than antenna switching application.

It is noted that in various switching configuration examples of FIGS. 21-31, switchable shunt paths are not shown for simplified views of the switching configurations. Accordingly, it will be understood that some or all of switchable paths in such switching configurations may or may not have associated with them switchable shunt paths (e.g., similar to the examples of FIGS. 29, 30 and 33-37).

Referring to the examples of FIGS. 23 and 24, it is noted that such examples are similar to the examples described herein in reference to FIGS. 29, 30 and 33-37. In some embodiments, the single pole (P) of the switch assembly 250 of FIG. 23 can be utilized as an antenna node (Ant) of the antenna switch 228, and the first and second throws (T1, T2) of the switch assembly 255 of FIG. 23 can be utilized as TRx1 and TRx2 nodes, respectively, of the antenna switch 265. Although each of the TRx1 and TRx2 nodes is indicated as providing transmit (Tx) and receive (Rx) functionalities, it will be understood that each of such nodes can be configured to provide either or both of such Tx and Rx functionalities.

In the examples of FIGS. 23 and 24, the SPDT functionality is shown to be provided by two SPST switches 100a, 100b, with the first SPST switch 100a providing a first switchable path between the pole P (Ant in FIG. 24) and the first throw T1 (TRx1 in FIG. 24), and the second SPST switch 100b providing a second switchable path between the pole P (Ant in FIG. 24) and the second throw T2 (TRx2 in FIG. 24). Accordingly, selective coupling of the pole (Ant) with either of the first throw T1 (TRx1) and the second throw T2 (TRx2) can be achieved by selective switching operations of the first and second SPST switches. For example, if a connection is desired between the pole (Ant) and the first throw T1 (TRx1), the first SPST switch 100a can be closed, and the second SPST switch 100b can be opened. Similarly, and as depicted in the example state in FIGS. 23 and 24, if a connection is desired between the pole (Ant) and the second throw T2 (TRx2), the first SPST switch 100a can be opened, and the second SPST switch 100b can be closed.

In the foregoing switching examples of FIGS. 23 and 24, a single TRx path is connected to the antenna (Ant) node in a given switch configuration. It will be understood that in some applications (e.g., carrier-aggregation applications), more than one TRx paths may be connected to the same antenna node. Thus, in the context of the foregoing switching configuration involving a plurality of SPST switches, more than one of such SPST switches can be closed to thereby connect their respective throws (TRx nodes) to the same pole (Ant).

Figure 25:
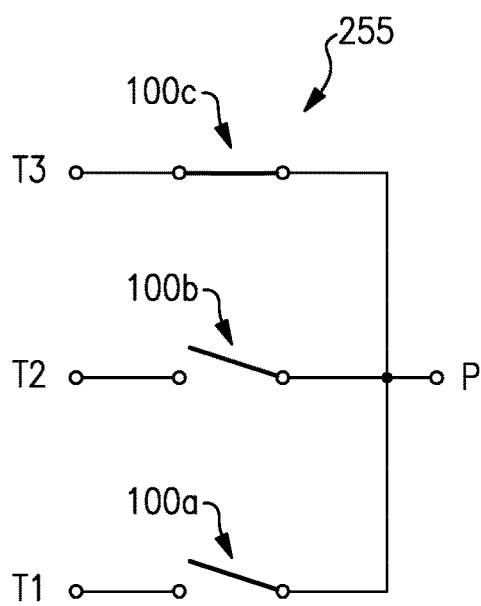
FIG. 25 shows an example of how three SPST switches having one or more features as described herein can be utilized to form a switch assembly having a single-pole-triple-throw (SP3T) configuration.
Figure 26:
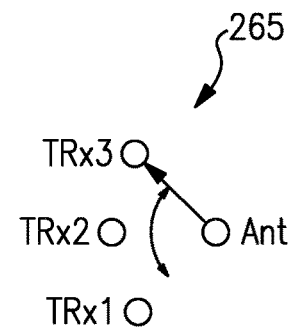
FIG. 26 shows that the switch assembly of FIG. 25 can be utilized in an antenna switch configuration.

FIG. 25 shows an example of how three SPST switches (e.g., similar to the examples of FIGS. 21, 22) having one or more features as described herein can be utilized to form a switch assembly 255 having a single-pole-triple-throw (SP3T) configuration. FIG. 26 shows, in a SP3T representation, that the switch assembly 255 of FIG. 25 can be utilized in an antenna switch configuration 265. It will be understood that one or more features of the present disclosure can also be utilized in switching applications other than antenna switching application.

Referring to the examples of FIGS. 25 and 26, it is noted that the SP3T configuration can be an extension of the SPDT configuration of FIGS. 23 and 24. For example, the single pole (P) of the switch assembly 255 of FIG. 25 can be utilized as an antenna node (Ant) of the antenna switch 265, and the first, second and third throws (T1, T2, T3) of the switch assembly 255 of FIG. 25 can be utilized as TRx1, TRx2 and TRx3 nodes, respectively, of the antenna switch 265. Although each of the TRx1, TRx2 and TRx3 nodes is indicated as providing transmit (Tx) and receive (Rx) functionalities, it will be understood that each of such nodes can be configured to provide either or both of such Tx and Rx functionalities.

In the examples of FIGS. 25 and 26, the SP3T functionality is shown to be provided by three SPST switches 100a, 100b, 100c, with the first SPST switch 100a providing a first switchable path between the pole P (Ant in FIG. 26) and the first throw T1 (TRx1 in FIG. 26), the second SPST switch 100b providing a second switchable path between the pole P (Ant in FIG. 26) and the second throw T2 (TRx2 in FIG. 26), and the third SPST switch 100c providing a third switchable path between the pole P (Ant in FIG. 26) and the third throw T3 (TRx3 in FIG. 26). Accordingly, selective coupling of the pole (Ant) with one of the first throw T1 (TRx1), the second throw T2 (TRx2), and the third throw T3 (TRx3) can be achieved by selective switching operations of the first, second and third SPST switches. For example, if a connection is desired between the pole (Ant) and the first throw T1 (TRx1), the first SPST switch 100a can be closed, and each of the second and third SPST switches 100b, 100c can be opened. If a connection is desired between the pole (Ant) and the second throw T2 (TRx2), the second SPST switch 100b can be closed, and each of the first and third SPST switches 100a, 100c can be opened. Similarly, and as depicted in the example state in FIGS. 25 and 26, if a connection is desired between the pole (Ant) and the third throw T3 (TRx3), each of the first and second SPST switches 100a, 100b can be opened, and the third SPST switch 100c can be closed.

In the foregoing switching examples of FIGS. 25 and 26, a single TRx path is connected to the antenna (Ant) node in a given switch configuration. It will be understood that in some applications (e.g., carrier-aggregation applications), more than one TRx paths may be connected to the same antenna node. Thus, in the context of the foregoing switching configuration involving a plurality of SPST switches, more than one of such SPST switches can be closed to thereby connect their respective throws (TRx nodes) to the same pole (Ant).

Based on the foregoing examples of SPST, SPDT and SP3T configurations of FIGS. 21-26, one can see that other switching configurations involving a single pole (SP) can be implemented utilizing SOI FET devices having one or more features as described herein. Thus, it will be understood that a switch having a SPNT can be implemented utilizing one or more SOI FET devices as described herein, where the quantity N is a positive integer.

Figure 27:
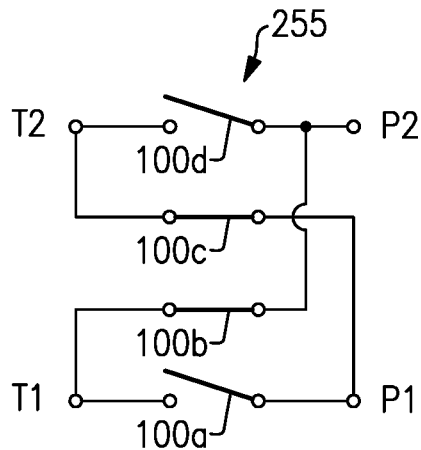
FIG. 27 shows an example of how four SPST switches having one or more features as described herein can be utilized to form a switch assembly having a double-pole-double-throw (DPDT) configuration.
Figure 28:
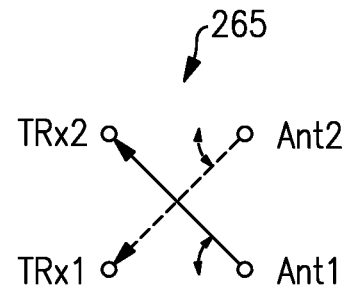
FIG. 28 shows that the switch assembly of FIG. 27 can be utilized in an antenna switch configuration.
Figure 29:
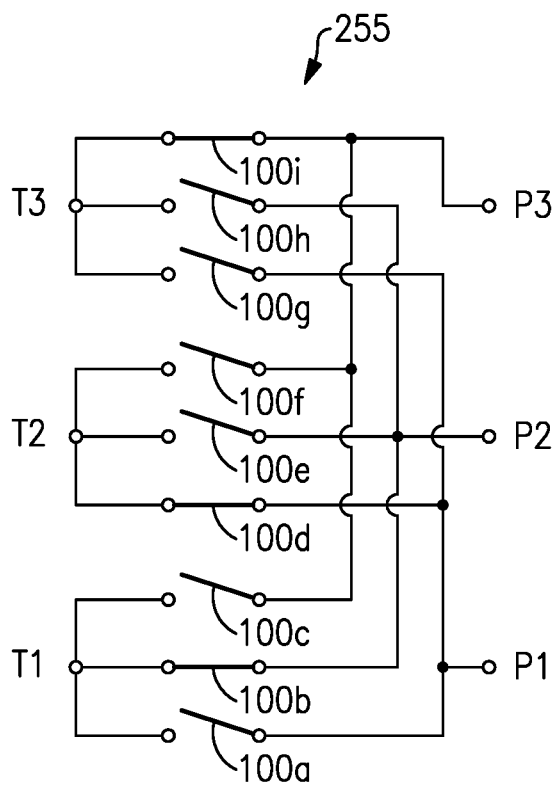
FIG. 29 shows an example of how nine SPST switches having one or more features as described herein can be utilized to form a switch assembly having a 3-pole-3-throw (3P3T) configuration.
Figure 30:
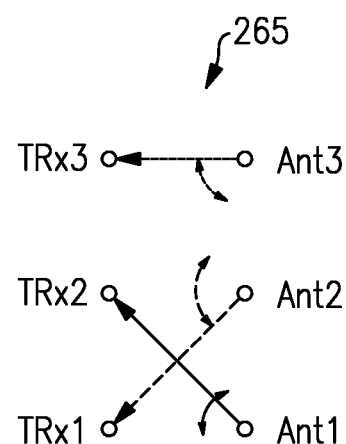
FIG. 30 shows that the switch assembly of FIG. 29 can be utilized in an antenna switch configuration.

Switching configurations of FIGS. 23-26 are examples where a single pole (SP) is connectable to one or more of a plurality of throws to provide the foregoing SPNT functionality. FIGS. 27-30 show examples where more than one poles can be provided in switching configurations. FIGS. 27 and 28 show examples related to a double-pole-double-throw (DPDT) switching configuration that can utilize a plurality of SOI FET devices having one or more features as described herein. Similarly, FIGS. 29 and 30 show examples related to a triple-pole-triple-throw (3P3T) switching configuration that can utilize a plurality of SOI FET devices having one or more features as described herein.

It will be understood that a switching configuration utilizing a plurality of SOI FET devices having one or more features as described herein can include more than three poles. Further, it is noted that in the examples of FIGS. 27-30, the number of throws (e.g., 2 in FIGS. 27 and 28, and 3 in FIGS. 29 and 30) are depicted as being the same as the corresponding number of poles for convenience. However, it will be understood that the number of throws may be different than the number of poles.

FIG. 27 shows an example of how four SPST switches (e.g., similar to the examples of FIGS. 21, 22) having one or more features as described herein can be utilized to form a switch assembly 255 having a DPDT configuration. FIG. 28 shows, in a DPDT representation, that the switch assembly 255 of FIG. 27 can be utilized in an antenna switch configuration 265. It will be understood that one or more features of the present disclosure can also be utilized in switching applications other than antenna switching application.

In the examples of FIGS. 27 and 28, the DPDT functionality is shown to be provided by four SPST switches 100a, 100b, 100c, 100d. The first SPST switch 100a is shown to provide a switchable path between a first pole P1 (Ant1 in FIG. 28) and a first throw T1 (TRx1 in FIG. 28), the second SPST switch 100b is shown to provide a switchable path between a second pole P2 (Ant2 in FIG. 28) and the first throw T1 (TRx1 in FIG. 28), the third SPST switch 100c is shown to provide a switchable path between the first pole P1 (Ant1 in FIG. 28) and a second throw T2 (TRx2 in FIG. 28), and the fourth SPST switch 100d is shown to provide a switchable path between the second pole P2 (Ant2 in FIG. 28) and the second throw T2 (TRx2 in FIG. 28). Accordingly, selective coupling between one or more of the poles (antenna nodes) with one or more of the throws (TRx nodes) can be achieved by selective switching operations of the four SPST switches 100a, 100b, 100c, 100d. Examples of such switching operations are described herein in greater detail.

FIG. 29 shows an example of how nine SPST switches (e.g., similar to the examples of FIGS. 21, 22) having one or more features as described herein can be utilized to form a switch assembly 255 having a 3P3T configuration. FIG. 30 shows, in a 3P3T representation, that the switch assembly 255 of FIG. 29 can be utilized in an antenna switch configuration 265. It will be understood that one or more features of the present disclosure can also be utilized in switching applications other than antenna switching application.

Referring to the examples of FIGS. 29 and 30, it is noted that the 3P3T configuration can be an extension of the DPDT configuration of FIGS. 27 and 28. For example, a third pole (P3) can be utilized as a third antenna node (Ant3), and a third throw (T3) can be utilized as a third TRx node (TRx3). Connectivity associated with such third pole and third throw can be implemented similar to the examples of FIGS. 27 and 28.

In the examples of FIGS. 29 and 30, the 3P3T functionality is shown to be provided by nine SPST switches 100a-100i. Such nine SPST switches can provide switchable paths as listed in Table 1.

TABLE 1

| SPST switch | Pole | Throw |
|---|---|---|
| 100a | P1 | T1 |
| 100b | P2 | T1 |
| 100c | P3 | T1 |
| 100d | P1 | T2 |
| 100e | P2 | T2 |
| 100f | P3 | T2 |
| 100g | P1 | T3 |
| 100h | P2 | T3 |
| 100i | P3 | T3 |

Based on the example of FIGS. 29 and 30, and Table 1, one can see that selective coupling between one or more of the poles (antenna nodes) with one or more of the throws (TRx nodes) can be achieved by selective switching operations of the nine SPST switches 100a-100i.

In many applications, switching configurations having a plurality of poles and a plurality of throws can provide increased flexibility in how RF signals can be routed therethrough. FIGS. 31A-31E show examples of how a DPDT switching configuration such as the examples of FIGS. 27 and 28 can be operated to provide different signal routing functionalities. It will be understood that similar control schemes can also be implemented for other switching configurations, such as the 3P3T examples of FIGS. 29 and 30.

In some wireless front-end architectures, two antennas can be provided, and such antennas can operate with two channels, with each channel being configured for either or both of Tx and Rx operations. For the purpose of description, it will be assumed that each channel is configured for both Tx and Rx operations (TRx). However, it will be understood that each channel does not necessarily need to have such TRx functionality. For example, one channel can be configured for TRx operations, while the other channel can be configured for Rx operation. Other configurations are also possible.

In the foregoing front-end architectures, there may be relatively simple switching states including a first state and a second state. In the first state, the first TRx channel (associated with the node TRx1) can operate with the first antenna (associated with the node Ant1), and the second TRx channel (associated with the node TRx2) can operate with the second antenna (associated with the node Ant2). In the second state, connections between the antenna nodes and the TRx nodes can be swapped from the first state. Accordingly, the first TRx channel (associated with the node TRx1) can operate with the second antenna (associated with the node Ant2), and the second TRx channel (associated with the node TRx2) can operate with the first antenna (associated with the node Ant1).

In some embodiments, such two states of the DPDT switching configuration can be controlled by a one-bit logic scheme, as shown in the example logic states in Table 2.

TABLE 2

| State | Control logic | TRx1-Ant1 connection | TRx1-Ant2 connection | TRx2-Ant1 connection | TRx2-Ant2 connection |
|---|---|---|---|---|---|
| 1 | 0 | Yes | No | No | Yes |
| 2 | 1 | No | Yes | Yes | No |

Figure 31A:
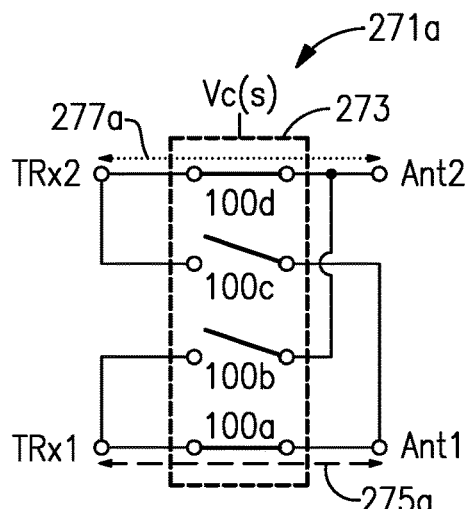
FIGS. 31A-31E show examples of how a DPDT switching configuration such as the examples of FIGS. 27 and 28 can be operated to provide different signal routing functionalities.
Figure 31B:
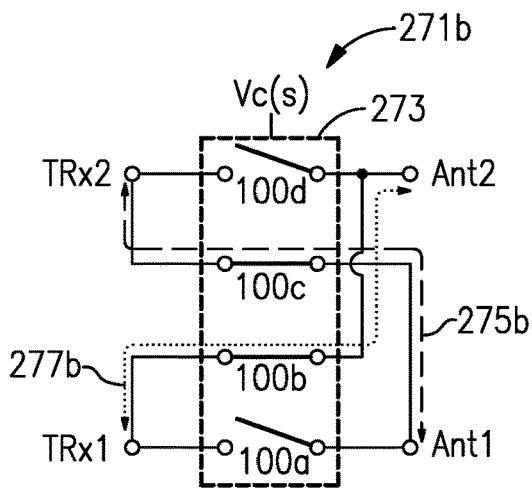

The first state (State 1) of the example of Table 2 is depicted in FIG. 31A as 271a, where the TRx1-Ant1 connection is indicated as path 275a, and the TRx2-Ant2 connection is indicated as path 277a. A control signal, representative of the control logic of Table 2, provided to the assembly (273) of the four SPST switches (100a, 100b, 100c, 100d) is collectively indicated as Vc(s). Similarly, the second state (State 2) of the example of Table 2 is depicted in FIG. 31B as 271b, where the TRx1-Ant2 connection is indicated as path 277b, and the TRx2-Ant1 connection is indicated as path 275b.

In some front-end architectures having a DPDT switching configuration, it may be desirable to have additional switching states. For example, it may be desirable to have only one path active among the two TRx channels and the two antennas. In another example, it may be desirable to disable all signal paths through the DPDT switch. Examples of 3-bit control logic that can be utilized to achieve such examples switching states are listed in Table 3.

TABLE 3

| State | Control logic (Vc1, Vc2, Vc3) | TRx1-Ant1 connection | TRx1-Ant2 connection | TRx2-Ant1 connection | TRx2-Ant2 connection |
|---|---|---|---|---|---|
| 1 | 0, 0, 0 | No | No | No | No |
| 2 | 0, 0, 1 | Yes | No | No | Yes |
| 3 | 0, 1, 0 | Yes | No | No | No |
| 4 | 0, 1, 1 | No | Yes | Yes | No |
| 5 | 1, 0, 0 | No | Yes | No | No |

Figure 31C:
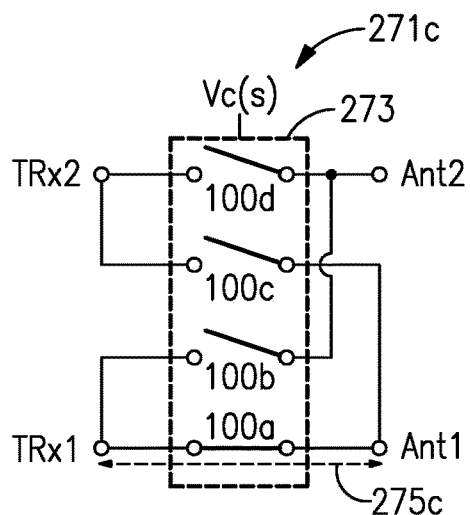
Figure 31D:
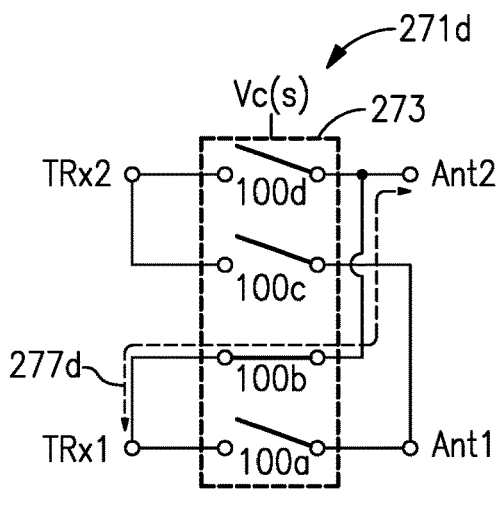
Figure 31E:
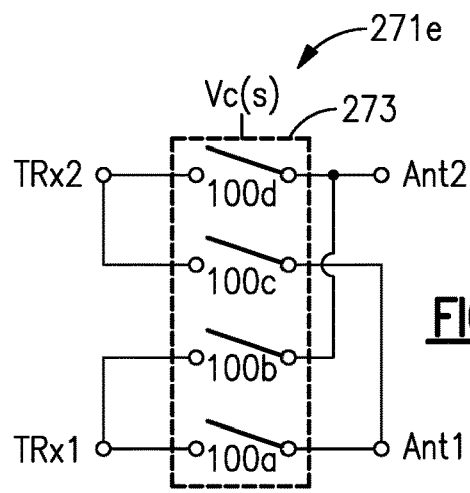

The first state (State 1) of the example of Table 3 is depicted in FIG. 31E as 271e, where all of the TRx-Ant paths are disconnected. A control signal indicated as Vc(s) in FIG. 31E and as listed in Table 3 can be provided to the assembly (272) of the four SPST switches (100a, 100b, 100c, 100d) to effectuate such a switching state.

The second state (State 2) of the example of Table 3 is depicted in FIG. 31A as 271a, where the TRx1-Ant1 connection is indicated as path 275a, and the TRx2-Ant2 connection is indicated as path 277a. A control signal indicated as Vc(s) in FIG. 31A and as listed in Table 3 can be provided to the assembly (273) of the four SPST switches (100a, 100b, 100c, 100d) to effectuate such a switching state.

The third state (State 3) of the example of Table 3 is depicted in FIG. 31C as 271c, where the TRx1-Ant1 connection is indicated as path 275c, and all other paths are disconnected. A control signal indicated as Vc(s) in FIG. 31C and as listed in Table 3 can be provided to the assembly (273) of the four SPST switches (100a, 100b, 100c, 100d) to effectuate such a switching state.

The fourth state (State 4) of the example of Table 3 is depicted in FIG. 31B as 271b, where the TRx1-Ant2 connection is indicated as path 277b, and the TRx2-Ant1 connection is indicated as path 275b. A control signal indicated as Vc(s) in FIG. 31B and as listed in Table 3 can be provided to the assembly (273) of the four SPST switches (100a, 100b, 100c, 100d) to effectuate such a switching state.

The fifth state (State 5) of the example of Table 3 is depicted in FIG. 31D as 270d, where the TRx1-Ant2 connection is indicated as path 277d, and all other paths are disconnected. A control signal indicated as Vc(s) in FIG. 31D and as listed in Table 3 can be provided to the assembly (273) of the four SPST switches (100a, 100b, 100c, 100d) to effectuate such a switching state.

As one can see, other switching configurations can also be implemented with the DPDT switch of FIGS. 31A-31E. It will also be understood that other switches such as 3P3T of FIGS. 29 and 30 can be controlled by control logic in a similar manner.

Examples of Implementations in Products

Various examples of FET-based circuits and bias/coupling configurations described herein can be implemented in a number of different ways and at different product levels. Some of such product implementations are described by way of examples. For example, as illustrated in FIGS. 32A-35 and described in detail below, bias/coupling circuitry and configurations may comprise manifolded gate resistance networks as described herein, wherein such bias/coupling circuitry may include any of the features or configurations as described above and/or understood by those having ordinary skill in the art in view of the present disclosure. For example bias/coupling circuitry 850, 950 in the illustrated diagrams may include manifolded gate resistance network(s) in accordance with the present disclosure.

Semiconductor Die Implementation

Figure 32A:
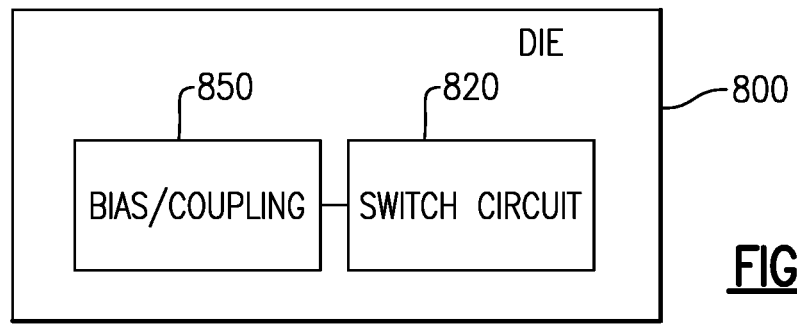
FIGS. 32A-32D depict non-limiting examples of switching circuits and bias/coupling circuits as described herein can be implemented on one or more semiconductor die.
Figure 32B:
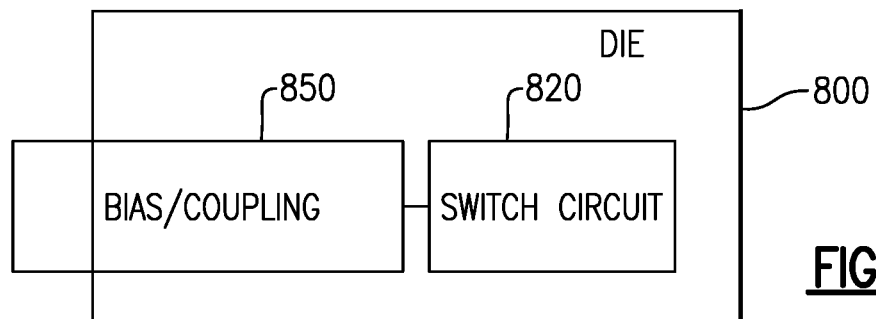

FIGS. 32A-32D schematically show non-limiting examples of such implementations on one or more semiconductor die. FIG. 32A shows that in some embodiments, a switch circuit 820 and a bias/coupling circuit 850, such as may include manifolded gate resistance in accordance with the present disclosure, can be implemented on a die 800. FIG. 32B shows that in some embodiments, at least some of the bias/coupling circuit 850 can be implemented outside of the die 800 of FIG. 32A.

Figure 32C:
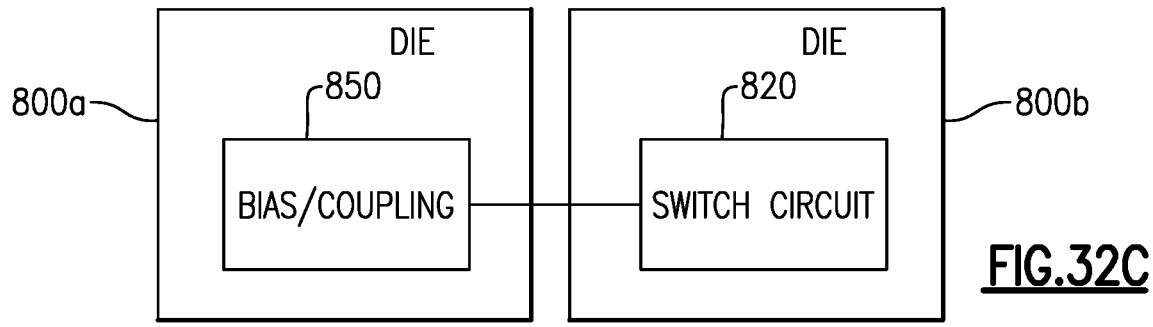
Figure 32D:
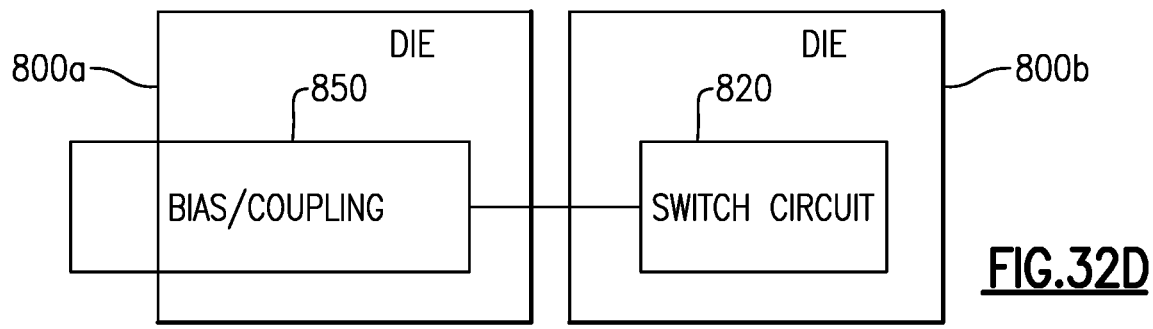

FIG. 32C shows that in some embodiments, a switch circuit 820 having one or more features as described herein can be implemented on a first die 800a, and a bias/coupling circuit 850 having one or more features as described herein can be implemented on a second die 800b. FIG. 32D shows that in some embodiments, at least some of the bias/coupling circuit 850 can be implemented outside of the first die 800a of FIG. 32C.

Packaged Module Implementation

Figure 33A:
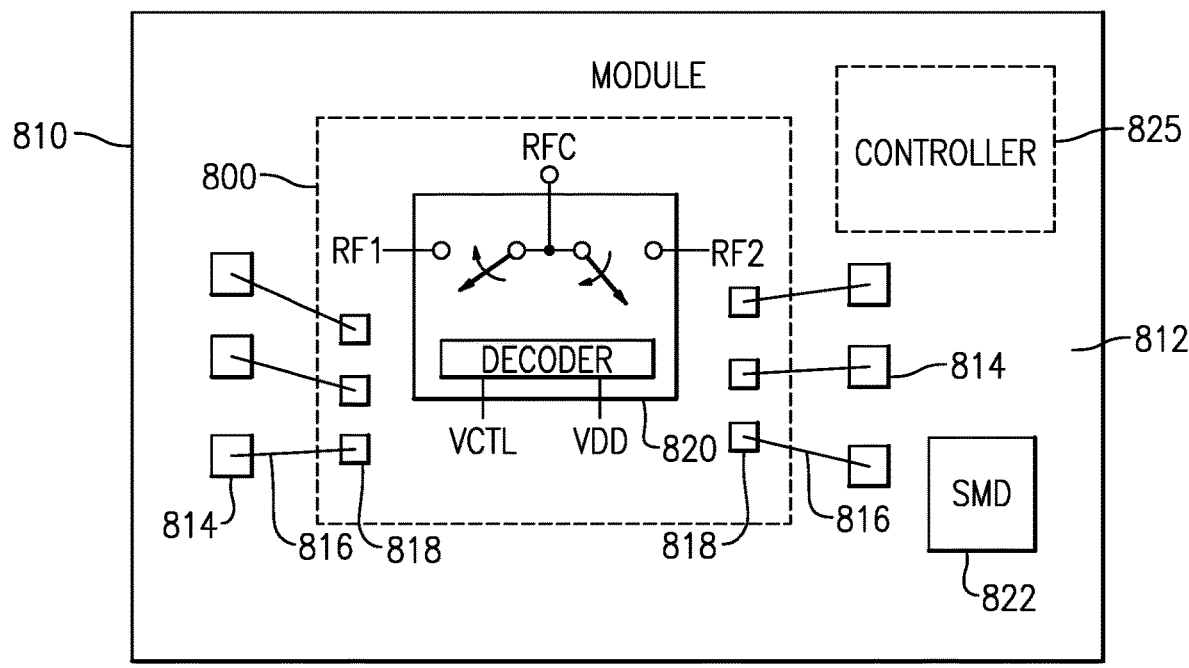
FIGS. 33A and 33B show plan and side views, respectively, of a packaged module having one or more features as described herein.

In some embodiments, one or more die having certain manifolded gate resistance network biasing features described herein can be implemented in a packaged module. An example of such a module is shown in FIGS. 33A (plan view) and 33B (side view). Although described in the context of both of the switch circuit and the bias/coupling circuit being on the same die (e.g., example configuration of FIG. 33A), it will be understood that packaged modules can be based on other configurations.

A module 810 is shown to include a packaging substrate 812. Such a packaging substrate can be configured to receive a plurality of components, and can include, for example, a laminate substrate. The components mounted on the packaging substrate 812 can include one or more dies. In the example shown, a die 800 having a switching circuit 820 and a bias/coupling circuit 850 is shown to be mounted on the packaging substrate 812. The die 800 can be electrically connected to other parts of the module (and with each other where more than one die is utilized) through connections such as connection-wirebonds 816. Such connection-wirebonds can be formed between contact pads 818 formed on the die 800 and contact pads 814 formed on the packaging substrate 812. In some embodiments, one or more surface mounted devices (SMDs) 822 can be mounted on the packaging substrate 812 to facilitate various functionalities of the module 810.

In some embodiments, the packaging substrate 812 can include electrical connection paths for interconnecting the various components with each other and/or with contact pads for external connections. For example, a connection path 832 is depicted as interconnecting the example SMD 822 and the die 800. In another example, a connection path 832 is depicted as interconnecting the SMD 822 with an external-connection contact pad 834. In yet another example a connection path 832 is depicted as interconnecting the die 800 with ground-connection contact pads 836.

In some embodiments, a space above the packaging substrate 812 and the various components mounted thereon can be filled with an overmold structure 830. Such an overmold structure can provide a number of desirable functionalities, including protection for the components and wirebonds from external elements, and easier handling of the packaged module 810.

Figure 33B:
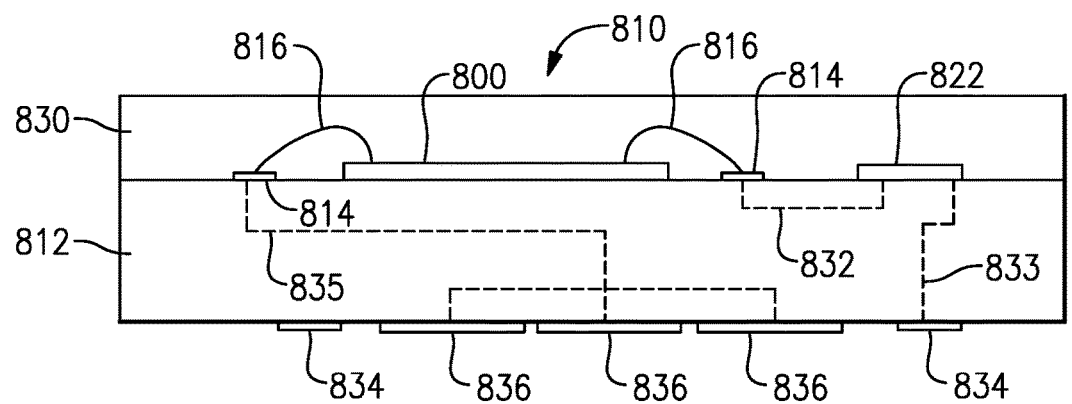
Figure 34:
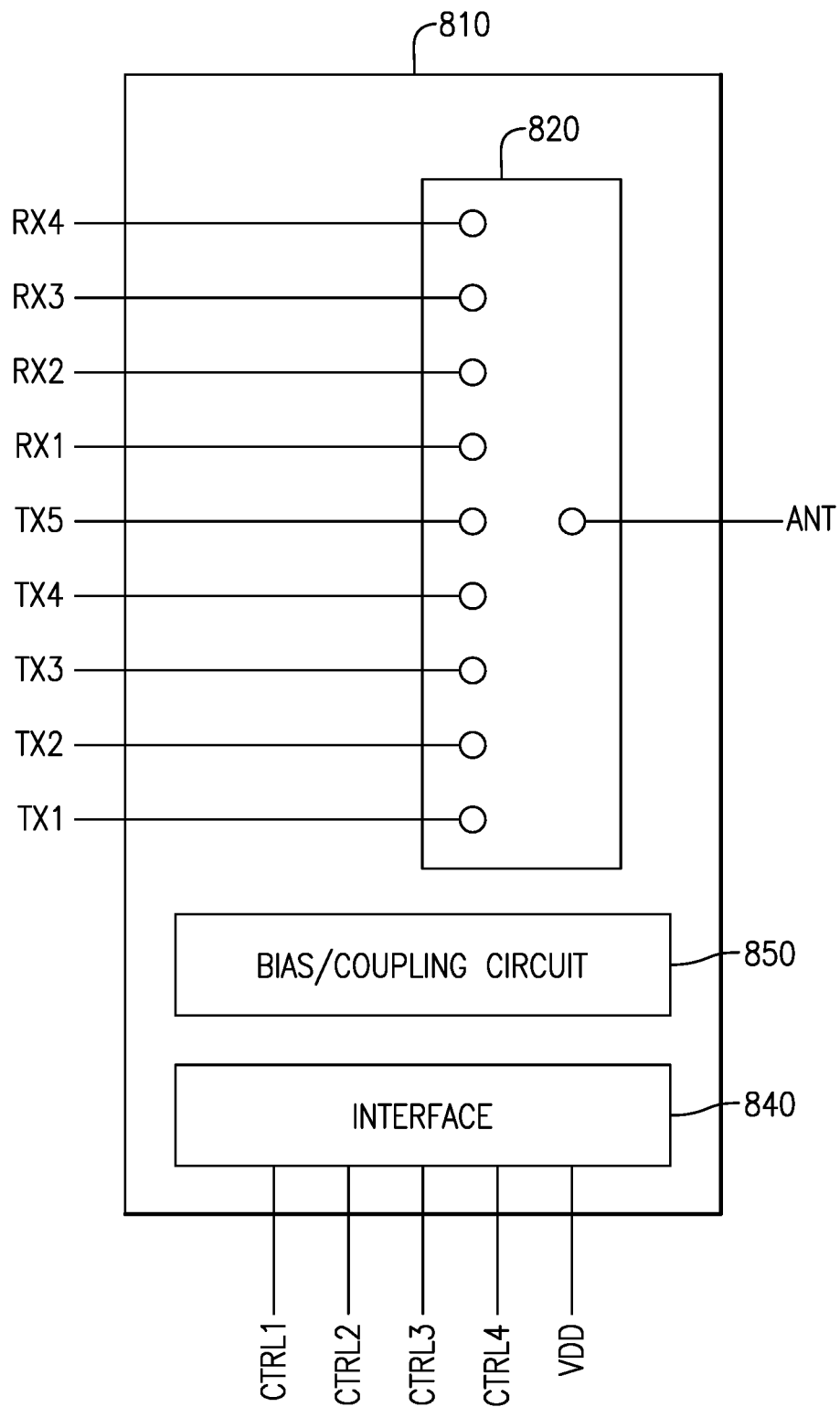
FIG. 34 shows a schematic diagram of an example switching configuration that can be implemented in the module of FIGS. 33A and 33B.

FIG. 34 shows a schematic diagram of an example switching configuration that can be implemented in the module 810 described in reference to FIGS. 33A and 33B. In the example, the switch circuit 820 is depicted as being an SP9T switch, with the pole being connectable to an antenna and the throws being connectable to various Rx and Tx paths. Such a configuration can facilitate, for example, multi-mode multi-band operations in wireless devices.

The module 810 can further include an interface for receiving power (e.g., supply voltage VDD) and control signals to facilitate operation of the switch circuit 820 and/or the bias/coupling circuit 150. In some implementations, supply voltage and control signals can be applied to the switch circuit 120 via the bias/coupling circuit 850.

Wireless Device Implementation

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 35:
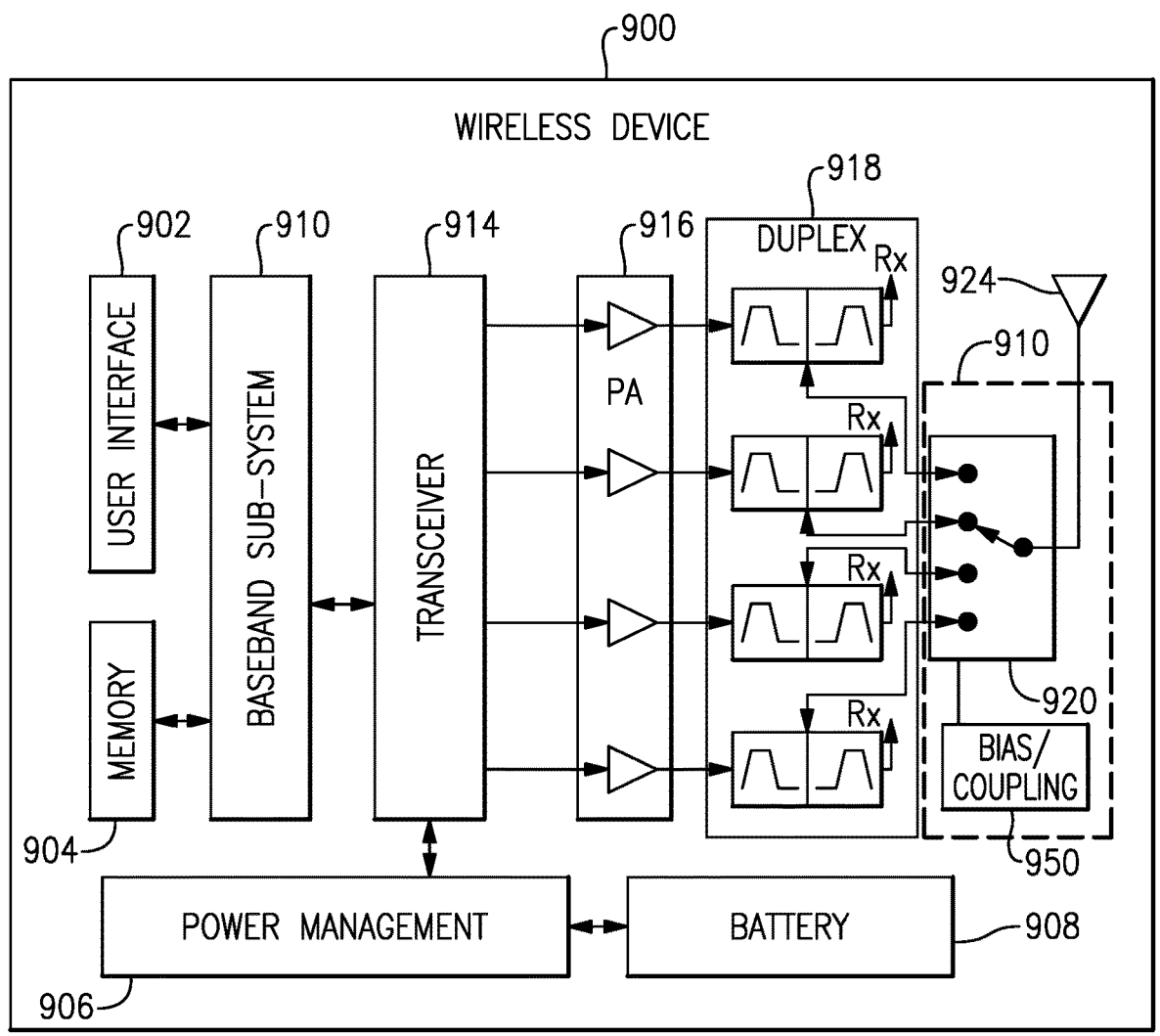
FIG. 35 depicts an example wireless device having one or more advantageous features described herein.

FIG. 35 schematically depicts an example wireless device 900 having one or more advantageous features described herein. In the context of various switches and various biasing/coupling configurations as described herein, a switch 120 and a bias/coupling circuit 150 can be part of a module 810. In some embodiments, such a switch module can facilitate, for example, multi-band, or multi-mode, operation of the wireless device 900.

In the example wireless device 900, a power amplifier (PA) module 916 having a plurality of PAs can provide an amplified RF signal to the switch 920 (via a duplexer 918), and the switch 920 can route the amplified RF signal to an antenna. The switch 920 may include one or more series and/or shunt arms having associated therewith bias/coupling circuitry 950 comprising manifolded gate resistance in accordance with the present disclosure.

The PA module 916 can receive an unamplified RF signal from a transceiver 914 that can be configured and operated in known manners. The transceiver can also be configured to process received signals. The transceiver 914 is shown to interact with a baseband sub-system 910 that is configured to provide conversion between data and/or voice signals suitable for a user and RF signals suitable for the transceiver 914. The transceiver 914 is also shown to be connected to a power management component 906 that is configured to manage power for the operation of the wireless device 900. Such a power management component can also control operations of the baseband sub-system 910 and the module 810.

The baseband sub-system 910 is shown to be connected to a user interface 902 to facilitate various input and output of voice and/or data provided to and received from the user. The baseband sub-system 910 can also be connected to a memory 904 that is configured to store data and/or instructions to facilitate the operation of the wireless device, and/or to provide storage of information for the user.

In some embodiments, the duplexer 918 can allow transmit and receive operations to be performed simultaneously using a common antenna (e.g., 924). In FIG. 35, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

General Comments

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio-frequency switch comprising:
a pole node;
a throw node connected to the pole node via a radio-frequency signal path coupled between the pole node and the throw node, the radio-frequency signal path including first, second, third and fourth field-effect transistors connected in series between the pole node and the throw node, each of the first, second, third and fourth field-effect transistors having a gate;
a first coupling path coupling the gate of the first field-effect transistor to the gate of the second field-effect transistor;
a second coupling path coupling the gate of the third field-effect transistor to the gate of the fourth field-effect transistor; and
a third coupling path coupling the first coupling path to the second coupling path.

2. The radio-frequency switch of claim 1 further comprising first, second, third and fourth resistors coupled to the gates of the first, second, third and fourth field-effect transistors, respectively.

3. The radio-frequency switch of claim 2 wherein the third coupling path is coupled to the first coupling path between the first and second resistors and coupled to the second coupling path between the third and fourth resistors.

4. The radio-frequency switch of claim 1 further comprising a gate control input node coupled to the third coupling path.

5. The radio-frequency switch of claim 4 wherein the third coupling path includes fifth and sixth resistors, the gate control input node being coupled to the third coupling path between the fifth and sixth resistors.

6. The radio-frequency switch of claim 1 wherein the radio-frequency signal path further includes fifth, sixth, seventh and eighth field-effect transistors connected in series with the first, second, third and fourth field-effect transistors, each of the fifth, sixth, seventh and eighth field-effect transistors having a gate.

7. The radio-frequency switch of claim 6 further comprising a fourth coupling path coupling the gate of the fifth field-effect transistor to the gate of the sixth field-effect transistor, a fifth coupling path coupling the gate of the seventh field-effect transistor to the gate of the eighth field-effect transistor, and a sixth coupling path coupling the fourth coupling path to the fifth coupling path.

8. The radio-frequency switch of claim 7 further comprising a seventh coupling path coupling the third coupling path to the sixth coupling path.

9. A radio-frequency switch comprising:
a pole node;
a throw node connected to the pole node via a radio-frequency signal path coupled between the pole node and the throw node;
a shunt arm connected between the radio-frequency signal path and a ground reference, the shunt arm including first, second, third and fourth field-effect transistors connected in series between the radio-frequency signal path and the ground reference, each of the first, second, third and fourth field-effect transistors having a gate node;
a first coupling path coupling the gate of the first field-effect transistor to the gate of the second field-effect transistor;
a second coupling path coupling the gate of the third field-effect transistor to the gate of the fourth field-effect transistor; and
a third coupling path coupling the first coupling path to the second coupling path.

10. The radio-frequency switch of claim 9 further comprising first, second, third and fourth resistors coupled to the gates of the first, second, third and fourth field-effect transistors, respectively.

11. The radio-frequency switch of claim 10 wherein the third coupling path is coupled to the first coupling path between the first and second resistors and coupled to the second coupling path between the third and fourth resistors.

12. The radio-frequency switch of claim 9 further comprising a gate control input node coupled to the third coupling path.

13. The radio-frequency switch of claim 12 further wherein the third coupling path includes fifth and sixth resistors, the gate control input node being coupled to the third coupling path between the fifth and sixth resistors.

14. The radio-frequency switch of claim 9 wherein the radio-frequency signal path further includes fifth, sixth, seventh and eighth field-effect transistors connected in series with the first, second, third and fourth field-effect transistors, each of the fifth, sixth, seventh and eighth field-effect transistors having a gate.

15. The radio-frequency switch of claim 14 further comprising a fourth coupling path coupling the gate of the fifth field-effect transistor to the gate of the sixth field-effect transistor, a fifth coupling path coupling the gate of the seventh field-effect transistor to the gate of the eighth field-effect transistor, and a sixth coupling path coupling the fourth coupling path to the fifth coupling path.

16. The radio-frequency switch of claim 15 further comprising a seventh coupling path coupling the third coupling path to the sixth coupling path.

17. A radio-frequency switch comprising:
a pole node connected to a first throw node via a first radio-frequency signal path, the first radio-frequency signal path including a first plurality of field-effect transistors connected in series between the pole node and the first throw node;
a second throw node connected to the pole node via a second radio-frequency signal path, the second radio-frequency signal path including a second plurality of field-effect transistors connected in series between the pole node and the second throw node;
a first shunt arm connected to the first radio-frequency signal path at a first shunt node, the first shunt arm including a third plurality of field-effect transistors connected in series between the first radio-frequency signal path and a ground reference;
a second shunt arm connected to the second radio-frequency signal path including a fourth plurality of field-effect transistors connected in series between the second radio-frequency signal path and the ground reference; and
a first manifolded gate resistance network connected to either the first plurality of field-effect transistors or the second plurality of field-effect transistors.

18. The radio-frequency switch of claim 17 wherein the first manifolded gate resistance network has at least three levels of gate resistances.

19. The radio-frequency switch of claim 17 wherein the first manifolded gate resistance network has at least four levels of gate resistances.

20. The radio-frequency switch of claim 17 further comprising a second manifolded gate resistance network connected to either the third plurality of field-effect transistors of the fourth plurality of field-effect transistors.

* * * * *